(12) United States Patent
Ding et al.

(10) Patent No.: US 11,437,374 B2
(45) Date of Patent: Sep. 6, 2022

(54) SEMICONDUCTOR DEVICE AND STACKED SEMICONDUCTOR CHIPS INCLUDING THROUGH CONTACTS

(71) Applicant: Samsung Electronics Co., Ltd., Suwon-si (KR)

(72) Inventors: Shaofeng Ding, Suwon-si (KR); Minguk Kang, Busan (KR); Jihyung Kim, Seoul (KR); Jeong Hoon Ahn, Seongnam-si (KR); Haeri Yoo, Hwaseong-si (KR); Yun Ki Choi, Yongin-si (KR)

(73) Assignee: SAMSUNG ELECTRONICS CO., LTD., Gyeongggi-Do ( * ) Notice: Subject to any disclaimer, the term of this patent is extended or adjusted under 35 U.S.C. 154(b) by 0 days.

(21) Appl. No.: 17/034,296

(22) Filed: Sep. 28, 2020

(65) Prior Publication Data

US 2021/0242203 A1 Aug. 5, 2021

(30) Foreign Application Priority Data

Feb. 5, 2020 (KR) ........................ 10-2020-0013892

(51) Int. Cl.
*H01L 27/092* (2006.01)
*H01L 25/065* (2006.01)
(Continued)

(52) U.S. Cl.
CPC ........ *H01L 27/092* (2013.01); *H01L 25/0657* (2013.01); *H01L 27/0207* (2013.01); *H01L 29/4175* (2013.01)

(58) Field of Classification Search
CPC ....... H01L 23/481; H01L 2225/06541–06544; H01L 2225/06548; H01L 21/76898; H01L 2224/02372; H01L 2224/05009; H01L 2224/05025; H01L 2224/05087; H01L 2224/0509; H01L 2224/0557; H01L 2224/08146; H01L 2224/13009; H01L 2224/13025; H01L 2224/16146; H01L 2224/29009; H01L 2224/29025; H01L 21/76885; H01L 23/5226; H01L 21/76877–76883; H01L 21/7684;
(Continued)

(56) References Cited

U.S. PATENT DOCUMENTS 8,828,745 B2 9/2014 Tsao et al.
9,252,141 B2 * 2/2016 Moon ................... H01L 23/481
(Continued)

*Primary Examiner* — Sonya McCall-Shepard
(74) *Attorney, Agent, or Firm* — Harness, Dickey & Pierce, P.L.C.

(57) ABSTRACT

A semiconductor device includes a substrate including a logic cell region and a connection region, a dummy transistor on the connection region, an intermediate connection layer on the dummy transistor, a first metal layer on the intermediate connection layer, an etch stop layer between the intermediate connection layer and the first metal layer, a through contact below the first metal layer penetrating the connection region, an upper portion of the through contact protruding above the etch stop layer, and a protection insulating pattern on the etch stop layer covering the upper portion of the through contact. The protection insulating pattern covers an upper side surface of the through contact and a top surface of the through contact.

19 Claims, 39 Drawing Sheets

(51) Int. Cl.

| | | |
|---|---|---|
| *H01L 27/02* | (2006.01) | |
| *H01L 29/417* | (2006.01) | |
| *H01L 21/768* | (2006.01) | |
| *H01L 27/088* | (2006.01) | |
| *H01L 29/165* | (2006.01) | |
| *H01L 29/08* | (2006.01) | |
| *B82Y 10/00* | (2011.01) | |
| *H01L 29/66* | (2006.01) | |
| *H01L 29/423* | (2006.01) | |
| *H01L 29/786* | (2006.01) | |
| *H01L 29/06* | (2006.01) | |
| *H01L 29/775* | (2006.01) | |
| *H01L 21/8238* | (2006.01) | |
| *H01L 23/522* | (2006.01) | |
| *H01L 25/18* | (2006.01) | |
| *H01L 21/8234* | (2006.01) | |
| *H01L 27/108* | (2006.01) | |
| *H01L 27/11* | (2006.01) | |
| *H01L 23/485* | (2006.01) | |
| *H01L 23/48* | (2006.01) | |
| *H01L 29/78* | (2006.01) | |

(58) Field of Classification Search
CPC ....... H01L 21/76841–76876; H01L 21/76831; H01L 23/53223; H01L 23/53238; H01L 23/53252; H01L 23/53266; H01L 2221/1073–1089; H01L 21/02362; H01L 21/823431; H01L 21/823821; H01L 21/845; H01L 29/66795–66818; H01L 29/41791; H01L 29/785–786; H01L 2029/7857–7858; H01L 27/0886; H01L 27/0924; H01L 27/10826; H01L 27/10879; H01L 27/1211; H01L 29/66636; H01L 29/0843–0886; H01L 21/823418–823425; H01L 21/823814; H01L 29/7848; H01L 29/42392; H01L 29/165; H01L 29/78696; H01L 21/823807; H01L 21/823412

See application file for complete search history.

(56) References Cited

U.S. PATENT DOCUMENTS

| | | |
|---|---|---|
| 9,437,547 B2 | 9/2016 | Lin et al. |
| 9,553,080 B1 | 1/2017 | England et al. |
| 9,978,666 B2 | 5/2018 | Wu et al. |
| 2002/0123193 A1* | 9/2002 | Yang ................ H01L 27/10894 438/253 |
| 2009/0315154 A1* | 12/2009 | Kirby ................ H01L 21/76895 257/621 |
| 2010/0187694 A1 | 7/2010 | Yu et al. |
| 2013/0270712 A1 | 10/2013 | Chen et al. |
| 2014/0357077 A1 | 12/2014 | Lee et al. |

\* cited by examiner

SEMICONDUCTOR DEVICE AND STACKED SEMICONDUCTOR CHIPS INCLUDING THROUGH CONTACTS

CROSS-REFERENCE TO RELATED APPLICATIONS

This U.S. non-provisional patent application claims priority under 35 U.S.C. § 119 to Korean Patent Application No. 10-2020-0013892, filed on Feb. 5, 2020, in the Korean Intellectual Property Office, the entire contents of which are hereby incorporated by reference.

BACKGROUND OF THE INVENTION

The present disclosure relates to semiconductor devices, and in particular, a semiconductor devices including a field effect transistor and a stack of semiconductor chips.

A semiconductor device includes an integrated circuit consisting of metal-oxide-semiconductor field-effect transistors (MOS-FETs). To meet an increasing demand for a semiconductor device with a small pattern size and a reduced design rule, the MOS-FETs are being scaled down. The scale-down of the MOS-FETs may lead to deterioration in operational properties of the semiconductor device. A variety of studies are being conducted to overcome technical limitations associated with the scale-down of the semiconductor device and to realize high performance semiconductor devices.

SUMMARY

An example embodiment of the inventive concepts provides semiconductor devices with improved reliability and a stack of semiconductor chips.

According to an example embodiment of the inventive concepts, a semiconductor device may include a substrate including a logic cell region and a connection region, a dummy transistor on the connection region, an intermediate connection layer on the dummy transistor, a first metal layer on the intermediate connection layer, an etch stop layer between the intermediate connection layer and the first metal layer, a through contact below the first metal layer penetrating the connection region, an upper portion of the through contact protruding above the etch stop layer, and a protection insulating pattern on the etch stop layer covering the upper portion of the through contact. The protection insulating pattern may cover an upper side surface of the through contact and a top surface of the through contact.

According to an example embodiment of the inventive concepts, a semiconductor device may include a substrate including a logic cell region and a connection region, a dummy transistor on the connection region, a first interlayer insulating layer on the dummy transistor, an intermediate connection layer in the first interlayer insulating layer, a second interlayer insulating layer on the first interlayer insulating layer, a first metal layer in the second interlayer insulating layer, an etch stop layer between the first and second interlayer insulating layers, a through contact below the first metal layer of the connection region and extended from a bottom of the second interlayer insulating layer to a bottom surface of the substrate, and a protection insulating pattern provided on the etch stop layer to cover an upper portion of the through contact. A top surface of the through contact may be higher than a top surface of the etch stop layer. The protection insulating pattern partially may cover the top surface of the etch stop layer. The protection insulating pattern may be extended from the top surface of the etch stop layer to the top surface of the through contact.

According to an example embodiment of the inventive concepts, a semiconductor device may include a substrate including a logic cell region and a connection region, an active pattern on each of the logic cell region and connection region, a device isolation layer covering a lower side surface of the active pattern, an upper portion of the active pattern protruding above the device isolation layer, a gate electrode crossing the active pattern, a source/drain pattern, which is adjacent to a side of the gate electrode and fills a recess in the upper portion of the active pattern, an intermediate connection layer on the gate electrode and the source/drain pattern, the intermediate connection layer including an active contact and a gate contact, which are electrically connected to the source/drain pattern and the gate electrode, respectively, a first metal layer on the intermediate connection layer, the first metal layer including interconnection lines and vias electrically connecting the interconnection lines to the intermediate connection layer, an etch stop layer between the intermediate connection layer and the first metal layer, a through contact below the first metal layer penetrating the connection region, an upper portion of the through contact protruding above the etch stop layer, and a protection insulating pattern on the etch stop layer to cover an upper portion of the through contact. At least one via of the vias may penetrate the protection insulating pattern and may be connected to the through contact. At least one interconnection line of the interconnection lines may be electrically connected to the through contact through the at least one via.

According to an example embodiment of the inventive concepts, a stack of semiconductor chips may include a memory chip and a logic chip stacked on the memory chip. The logic chip may include a substrate, the substrate including an integrated circuit, a metal layer on the substrate, and a through contact below the metal layer penetrating the substrate. The through contact may be connected to a metal layer of the memory chip.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

DETAILED DESCRIPTION

Figure 1:
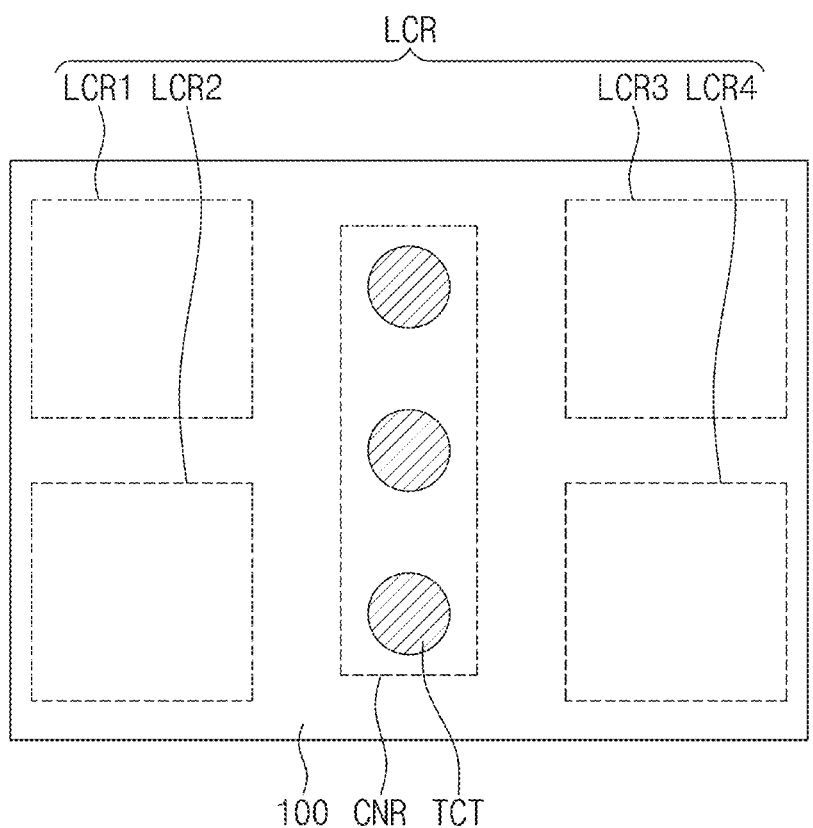
FIG. 1 is a plan view illustrating a semiconductor device according to an example embodiment of the inventive concepts.
Figure 1:
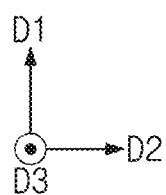

FIG. 1 is a plan view illustrating a semiconductor device according to an example embodiment of the inventive concepts.

Referring to FIG. 1, a logic chip LGC may be provided. The logic chip LGC may include logic cell regions LCR on a substrate 100. In an example embodiment, the logic cell regions LCR may include first to fourth logic cell regions LCR1-LCR4. The first to fourth logic cell regions LCR1-LCR4 may be two-dimensionally arranged on the substrate 100. Each of the logic cell regions LCR may be a region, in which logic cells (e.g., standard cells) constituting a logic circuit are disposed.

The logic chip LGC may further include a connection region CNR, which is provided between the logic cell regions LCR. The first to fourth logic cell regions LCR1-LCR4 may be disposed around the connection region CNR. At least one through contact TCT may be provided in the connection region CNR.

Figure 2:
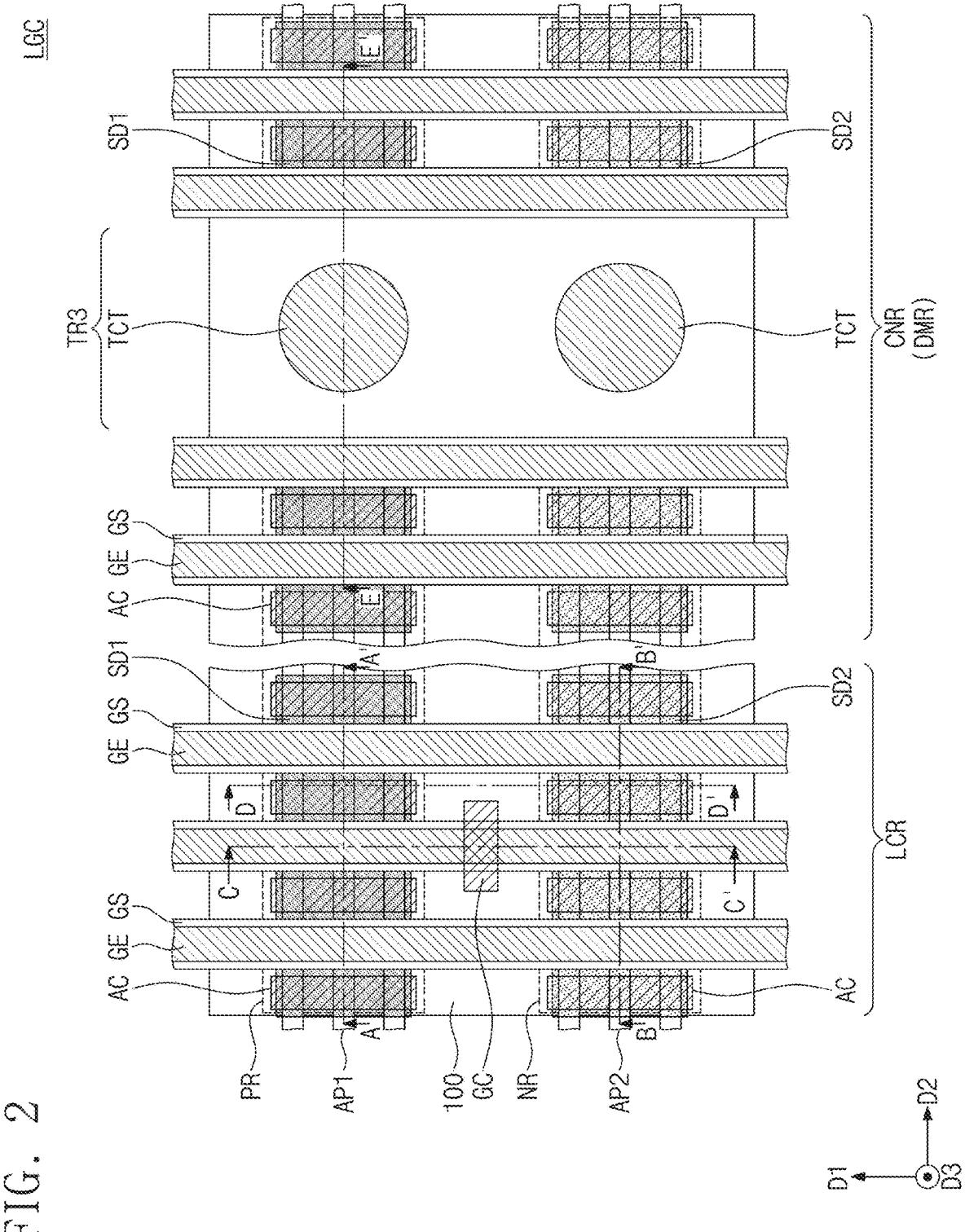
FIG. 2 is an enlarged plan view illustrating a logic cell region and a connection region of FIG. 1.

FIG. 2 is an enlarged plan view illustrating a logic cell region and a connection region of FIG. 1. FIGS. 3A to 3E are sectional views taken along lines A-A', B-B', C-C', D-D', and E-E', respectively, of FIG. 2.

Hereinafter, the logic cell region LCR of the logic chip LGC will be described in more detail with reference to FIGS. 2 and 3A to 3D. The logic cell region LCR may include a logic cell (e.g., a standard cell) constituting the logic circuit. The logic cell region LCR shown in FIG. 2 may be an example of a single logic cell.

The substrate 100 may include a first active region PR and a second active region NR. In an example embodiment, the first active region PR may be a PMOSFET region, and the second active region NR may be an NMOSFET region. The substrate 100 may be a semiconductor substrate (e.g., of silicon, germanium, or silicon-germanium) or a compound semiconductor substrate. As an example, the substrate 100 may be a silicon wafer.

The first and second active regions PR and NR may be defined by a second trench TR2, which is formed in an upper portion of the substrate 100. The second trench TR2 may be positioned between the first and second active regions PR and NR. The first and second active regions PR and NR may be spaced apart from each other, in a first direction D1, with the second trench TR2 interposed therebetween. Each of the first and second active regions PR and NR may be extended in a second direction D2 crossing the first direction D1.

First active patterns AP1 and second active patterns AP2 may be provided on the first active region PR and the second active region NR, respectively. The first and second active patterns AP1 and AP2 may be extended in the second direction D2 to be parallel to each other. The first and second active patterns AP1 and AP2 may be portions of the substrate 100, which have a vertically protruding shape. A first trench TR1 may be defined between adjacent ones of the first active patterns AP1 and between adjacent ones of the second active patterns AP2. The first trench TR1 may be shallower than the second trench TR2.

A device isolation layer ST may be provided to fill the first and second trenches TR1 and TR2. The device isolation layer ST may include a silicon oxide layer. Upper portions of the first and second active patterns AP1 and AP2 may protrude vertically above the device isolation layer ST (e.g., see FIG. 3C). Each of the upper portions of the first and second active patterns AP1 and AP2 may be shaped like a fin. The device isolation layer ST may not cover the upper portions of the first and second active patterns AP1 and AP2. The device isolation layer ST may cover lower side surfaces of the first and second active patterns AP1 and AP2.

First source/drain patterns SD1 may be provided on the upper portions of the first active patterns AP1. The first source/drain patterns SD1 may be impurity regions of a first conductivity type (e.g., p-type). A first channel pattern CH1 may be interposed between each pair of the first source/drain patterns SD1. Second source/drain patterns SD2 may be provided on the upper portions of the second active patterns AP2. The second source/drain patterns SD2 may be impurity regions of a second conductivity type (e.g., n-type). A second channel pattern CH2 may be interposed between each pair of the second source/drain patterns SD2.

The first and second source/drain patterns SD1 and SD2 may be epitaxial patterns, which are formed by a selective epitaxial growth process. As an example, the first and second source/drain patterns SD1 and SD2 may have top surfaces that are coplanar with top surfaces of the first and second channel patterns CH1 and CH2. As another example, the top surfaces of the first and second source/drain patterns SD1 and SD2 may be higher than the top surfaces of the first and second channel patterns CH1 and CH2.

The first source/drain patterns SD1 may include a semiconductor material (e.g., SiGe) whose lattice constant is larger than a lattice constant of a semiconductor material in the substrate 100. In this case, the first source/drain patterns SD1 may exert a compressive stress on the first channel patterns CH1. By contrast, the second source/drain patterns SD2 may, for example, include the same semiconductor material (e.g., Si) as the substrate 100.

Gate electrodes GE may be provided to cross the first and second active patterns AP1 and AP2 and to extend in the first direction D1. The gate electrodes GE may be spaced apart from each other with a specific pitch in the second direction D2. The gate electrodes GE may be overlapped with the first and second channel patterns CH1 and CH2, when viewed in a plan view. Each of the gate electrodes GE may surround the top and side surfaces of each of the first and second channel patterns CH1 and CH2.

Referring back to FIG. 3C, the gate electrode GE may be provided on a first top surface TS1 of the first channel pattern CH1 and at least one first side surface SW1 of the first channel pattern CH1. The gate electrode GE may be provided on a second top surface TS2 of the second channel pattern CH2 and at least one second side surface SW2 of the second channel pattern CH2. In other words, the transistor according to some example embodiments may be a three-dimensional field-effect transistor (e.g., FinFET), in which the gate electrode GE is provided to three-dimensionally surround the channel patterns CH1 and CH2.

Referring back to FIGS. 2 and 3A to 3D, a pair of gate spacers GS may be disposed on both side surfaces of each of the gate electrodes GE. The gate spacers GS may be extended along the gate electrodes GE and in the first direction D1. Top surfaces of the gate spacers GS may be higher than those of the gate electrodes GE. The top surfaces of the gate spacers GS may be coplanar with a top surface of a first interlayer insulating layer 110, which will be described below. The gate spacers GS may be formed of or include at least one of SiCN, SiCON, or SiN. Alternatively, the gate spacers GS may be a multi-layered structure that includes at least two layers formed of at least two of SiCN, SiCON, or SiN.

A gate capping pattern GP may be provided on each of the gate electrodes GE. The gate capping pattern GP may be extended along the gate electrode GE and in the first direction D1. The gate capping pattern GP may be formed of or include at least one of materials, which are selected to have an etch selectivity (etch rate ratio) with respect to first and second interlayer insulating layers 110 and 120 to be described below. For example, the gate capping patterns GP may be formed of or include at least one of SiON, SiCN, SiCON, or SiN.

A gate dielectric pattern GI may be interposed between the gate electrode GE and the first active pattern AP1 and between the gate electrode GE and the second active pattern AP2. The gate dielectric pattern GI may be extended along a bottom surface of the gate electrode GE thereon. As an example, the gate dielectric pattern GI may cover the first top surface TS1 and the first side surface SW1 of the first channel pattern CH1. The gate dielectric pattern GI may cover not only the second top surface TS2 of the second channel pattern CH2 but also both of the second side surfaces SW2 of the second channel pattern CH2. The gate dielectric pattern GI may cover the top surface of the device isolation layer ST, which is located below the gate electrode GE (e.g., see FIG. 3C).

In an example embodiment, the gate dielectric pattern GI may be formed of or include a high-k dielectric material whose dielectric constant is higher than that of silicon oxide. For example, the high-k dielectric material may include at least one of hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, or lead zinc niobate.

The gate electrode GE may include a first metal pattern and a second metal pattern on the first metal pattern. The first metal pattern may be provided on the gate dielectric pattern GI and may be adjacent to the first and second channel patterns CH1 and CH2. The first metal pattern may include a work function metal, which can be used to adjust a threshold voltage of the transistor. By adjusting a thickness and composition of the first metal pattern, it may be possible to realize a transistor having a desired threshold voltage.

The first metal pattern may include a metal nitride layer. For example, the first metal pattern may include at least one metal, which is selected from the group consisting of titanium (Ti), tantalum (Ta), aluminum (Al), tungsten (W) and molybdenum (Mo), and nitrogen (N). The first metal pattern may further contain carbon (C). The first metal pattern may include a plurality of stacked work function metal layers.

The second metal pattern may include a metallic material, whose resistance is lower than the first metal pattern. For example, the second metal pattern may include at least one metal selected from the group consisting of tungsten (W), aluminum (Al), titanium (Ti), and tantalum (Ta).

A first interlayer insulating layer 110 may be provided on the substrate 100. The first interlayer insulating layer 110 may cover the gate spacers GS and the first and second source/drain patterns SD1 and SD2. A top surface of the first interlayer insulating layer 110 may be substantially coplanar with the top surfaces of the gate capping patterns GP and the top surfaces of the gate spacers GS. A second interlayer insulating layer 120 may be provided on the first interlayer insulating layer 110 to cover the gate capping patterns GP. A third interlayer insulating layer 130 may be provided on the second interlayer insulating layer 120. A fourth interlayer insulating layer 140 may be provided on the third interlayer insulating layer 130. In an example embodiment, the first to fourth interlayer insulating layers 110-140 may be formed of or include silicon oxide.

Active contacts AC may be provided to penetrate the first and second interlayer insulating layers 110 and 120 and may be electrically connected to the first and second source/drain patterns SD1 and SD2, respectively. Each of the active contacts AC may be disposed between a pair of the gate electrodes GE.

The active contact AC may be a self-aligned contact. For example, the active contact AC may be formed by a self-alignment process using the gate capping pattern GP and the gate spacer GS. For example, the active contact AC may cover at least a portion of a side surface of the gate spacer GS. Although not shown, the active contact AC may cover a portion of the top surface of the gate capping pattern GP.

A silicide pattern SC may be interposed between the active contact AC and the first source/drain pattern SD1 and between the active contact AC and the second source/drain pattern SD2. The active contact AC may be electrically connected to the source/drain pattern SD1 and SD2 through the silicide pattern SC. The silicide pattern SC may be formed of or include at least one of metal-silicides (e.g., titanium silicide, tantalum silicide, tungsten silicide, nickel silicide, and/or cobalt silicide).

The active contact AC may include a conductive pattern FM and a barrier pattern BM surrounding the conductive pattern FM. For example, the conductive pattern FM may be formed of or include at least one of metallic materials (e.g., aluminum, copper, tungsten, molybdenum, and/or cobalt). The barrier pattern BM may cover side and bottom surfaces of the conductive pattern FM. The barrier pattern BM may include a metal nitride layer or may include a metal layer and a metal nitride layer. The metal layer may be formed of or include at least one of titanium, tantalum, tungsten, nickel, cobalt, or platinum. The metal nitride layer may be formed of or include at least one of titanium nitride (TiN), tantalum nitride (TaN), tungsten nitride (WN), nickel nitride (NiN), cobalt nitride (CoN), or platinum nitride (PtN).

At least one gate contact GC may be provided to penetrate the second interlayer insulating layer 120 and the gate capping pattern GP and may be electrically connected to the gate electrode GE. When viewed in a plan view, the gate contact GC may be disposed between the first and second active regions PR and NR. The gate contact GC may be disposed on the device isolation layer ST filling the second trench TR2.

The gate contact GC may include the conductive pattern FM and the barrier pattern BM surrounding the conductive pattern FM. The conductive pattern FM and the barrier pattern BM of the gate contact GC may be respectively provided to have substantially the same features as those of the active contact AC.

Connection patterns CNP may be provided in the third interlayer insulating layer 130. The connection patterns CNP may be provided on the active contacts AC and the gate contact GC, respectively. The connection patterns CNP may connect the active and gate contacts AC and GC to a metal layer, which will be described below. The connection patterns CNP may be provided between the active and gate contacts AC and GC and the metal layer, and this may make it possible to increase a degree of freedom in a routing process. For example, referring to FIG. 3C, the connection pattern CNP, which is provided on the gate contact GC, may connect the gate contact GC to an interconnection line INL, which is horizontally offset from the gate contact GC. In an example embodiment, the connection patterns CNP may be omitted.

The active and gate contacts AC and GC in the second interlayer insulating layer 120 and the connection patterns CNP in the third interlayer insulating layer 130 may include an intermediate connection layer MCL. The intermediate connection layer MCL may electrically connect a first metal layer M1, which will be described below, to the transistors on the substrate 100. The intermediate connection layer MCL may be a layer formed by a middle-of-line (MOL) process, which will be described below.

An etch stop layer ESL may be interposed between the third interlayer insulating layer 130 and the fourth interlayer insulating layer 140. For example, the etch stop layer ESL may include a silicon oxide layer.

The first metal layer M1 may be provided in the fourth interlayer insulating layer 140. The first metal layer may include the interconnection lines INL and the vias VI. The vias VI may be respectively provided below the interconnection lines INL. For example, the interconnection lines INL may be extended in the second direction D2 and parallel to each other. The interconnection lines INL may be arranged at a constant pitch in the first direction D1. The vias VI may be respectively interposed between the interconnection lines INL and the connection patterns CNP to electrically connect them to each other. Each of the vias VI may be provided to penetrate the etch stop layer ESL and to be in contact with a top surface of the connection pattern CNP.

The interconnection lines INL and the vias VI may be formed of or include the same conductive material. The interconnection lines INL and the vias VI may be formed of or include at least one metallic material of, for example, aluminum, copper, tungsten, molybdenum, ruthenium, or cobalt. Although not shown, metal layers (e.g., a second metal layer, a third metal layer, a fourth metal layer, and so forth) may be additionally stacked on the fourth interlayer insulating layer 140. The stacked metal layers may include routing interconnection lines, which are used to connect logic cells.

Hereinafter, the connection region CNR of the logic chip LGC will be described in more detail with reference to FIGS. 2 and 3E. The connection region CNR may include at least one dummy cell region DMR and at least one through contact TCT.

The dummy cell region DMR may have substantially the same structure as the logic cell region LCR described above. That is, the dummy cell region DMR may include the first active region PR, the second active region NR, and three-dimensional field effect transistors thereon, like the logic cell region LCR. The active contacts AC, the gate contacts GC, the connection patterns CNP, and the first metal layer M1 may be provided on the dummy cell region DMR, in the same manner as those on the logic cell region LCR.

However, the dummy cell region DMR of the connection region CNR may be a dummy region, which is not used to realize a logic circuit, unlike the logic cell region LCR. In other words, a transistor on the dummy cell region DMR may be a dummy transistor. However, if any pattern is not formed on the dummy cell region DMR because the dummy cell region DMR does not serve as an effective logic cell, a pattern density of the dummy cell region DMR may be significantly reduced in a photolithography process for forming the logic cell regions LCR. This may lead to a process failure in a photolithography process. Thus, processes for forming the logic cell regions LCR may also be performed on the dummy cell region DMR in the same manner.

Referring back to FIG. 1, the through contact TCT may be provided to be spaced apart from the logic cell regions LCR by a specific distance. Thus, the through contact TCT may be locally provided on only the connection region CNR (i.e., the dummy cell region DMR), except for the logic cell regions LCR.

Referring back to FIGS. 2 and 3E, a third trench TR3 may be formed in an upper portion of the substrate 100 to divide the first active pattern AP1 into two portions in the second direction D2. The device isolation layer ST may fill the third trench TR3.

The through contact TCT may be provided on the third trench TR3. The through contact TCT may penetrate the device isolation layer ST filling the third trench TR3 and the substrate 100 thereunder. The through contact TCT may be provided below the first metal layer M1. The through contact TCT may be vertically extended from a bottom of the fourth interlayer insulating layer 140 to a bottom surface of the substrate 100.

A passivation layer PAV may be provided on the bottom surface of the substrate 100. The passivation layer PAV may enclose an exposed lower portion of the through contact TCT. An upper portion of the through contact TCT may penetrate the etch stop layer ESL and may protrude above the etch stop layer ESL. A protection insulating pattern PIP may be provided to cover the protruding upper portion of the through contact TCT. In detail, the protection insulating pattern PIP may cover a top surface TCTt of the through contact TCT and an upper side surface TCTu of the through contact TCT. The protection insulating pattern PIP may be formed of or include at least one of SiN, SiCN, or SiON.

The top surface TCTt of the through contact TCT may be higher than a top surface ESLt of the etch stop layer ESL. The top surface TCTt of the through contact TCT may be positioned at a level between bottom and top surfaces of the fourth interlayer insulating layer 140. The protection insulating pattern PIP may cover a portion of a top surface of the etch stop layer ESL adjacent to the through contact TCT. The protection insulating pattern PIP may be extended from the top surface of the etch stop layer ESL to the top surface TCTt of the through contact TCT.

At least one via VI of the first metal layer M1 may penetrate the protection insulating pattern PIP and may be in contact with the top surface TCTt of the through contact TCT. In other words, the interconnection line INL of the first metal layer M1 may be electrically connected to the through contact TCT through the at least one via VI.

The through contact TCT may include the conductive pattern FM, the barrier pattern BM surrounding the conductive pattern FM, and an insulating spacer SPC. The conductive pattern FM may be a vertically-extended pillar-shaped pattern. The barrier pattern BM may surround an outer side surface of the conductive pattern FM. The barrier pattern BM may be provided to expose top and bottom surfaces of the conductive pattern FM. The insulating spacer SPC may surround an outer side surface of the barrier pattern BM.

The conductive pattern FM may be formed of or include at least one metallic material of aluminum, copper, tungsten, molybdenum, or cobalt. The barrier pattern BM may include a metal nitride layer or may include a metal layer and a metal nitride layer.

Figure 11A:
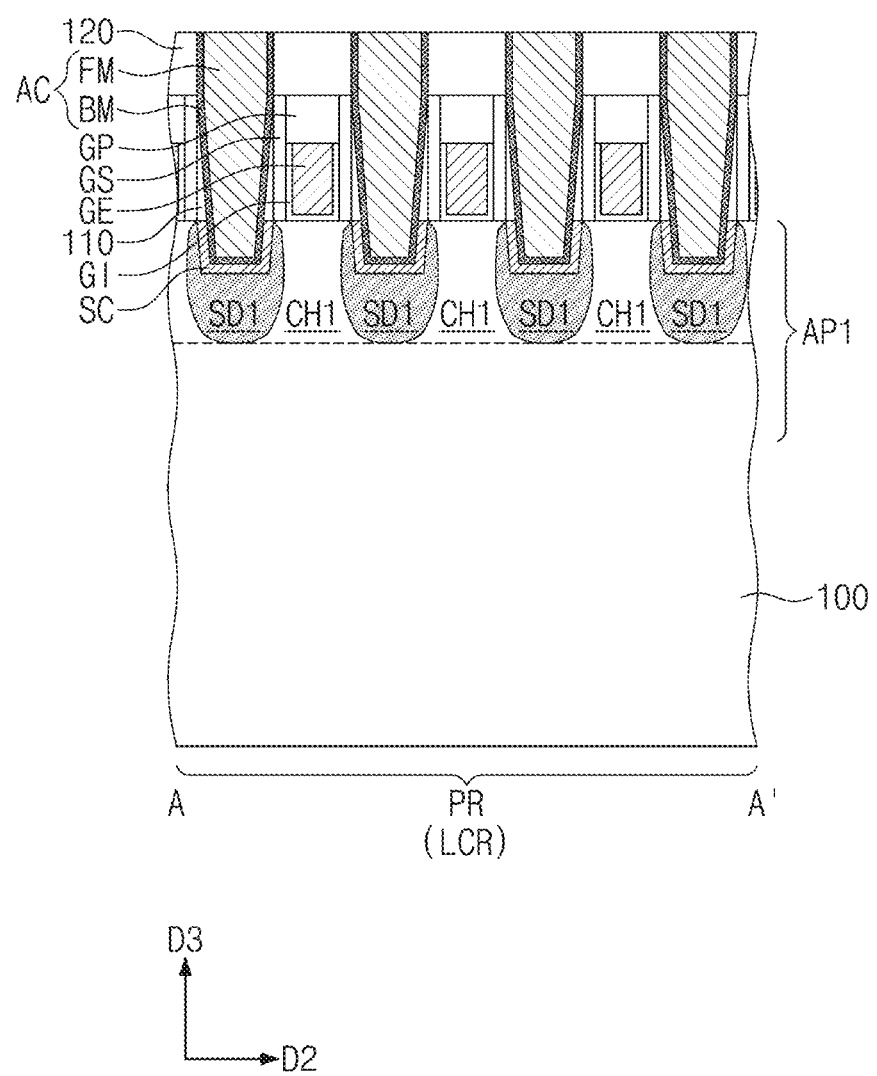
Figure 11B:
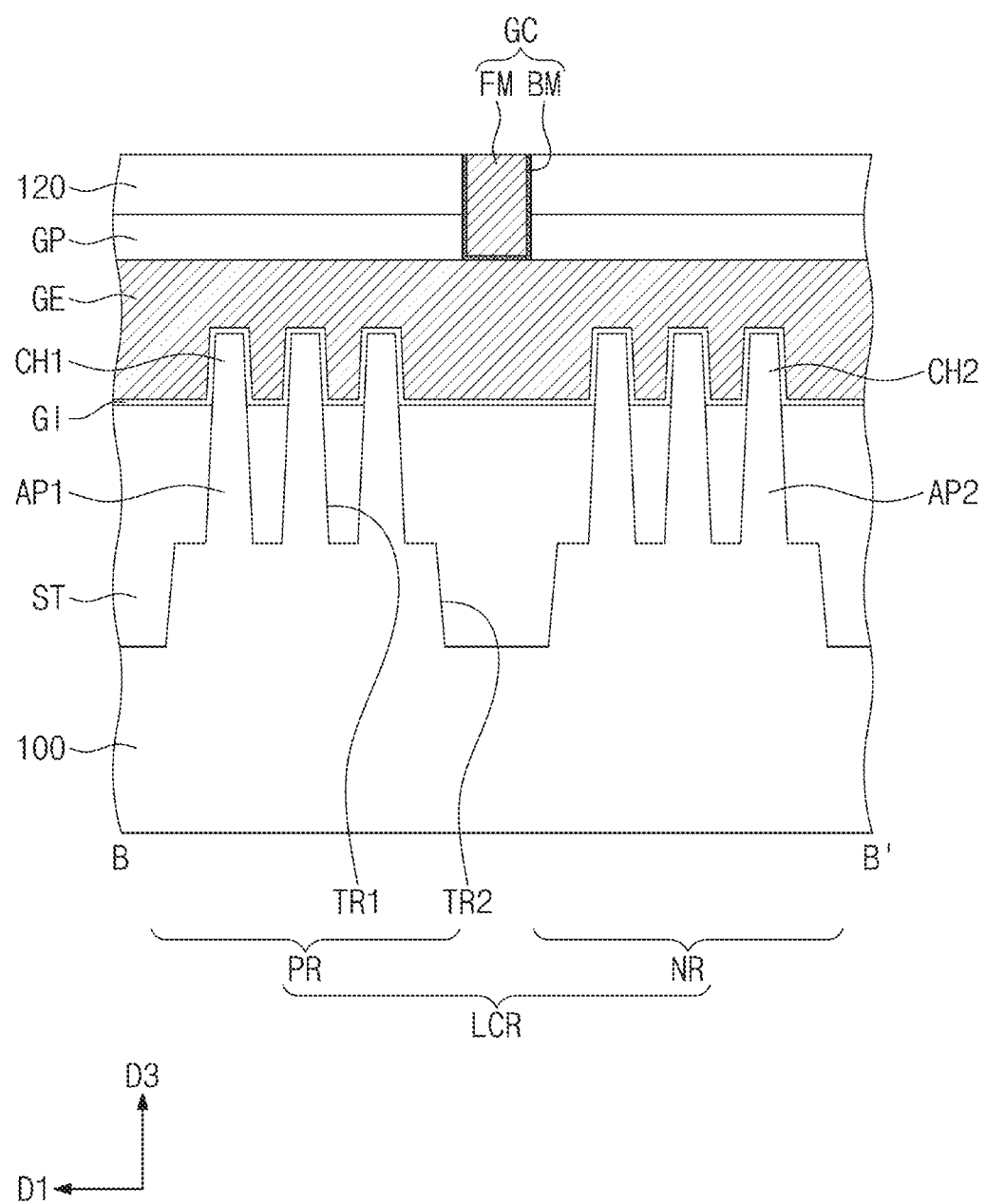
Figure 11C:
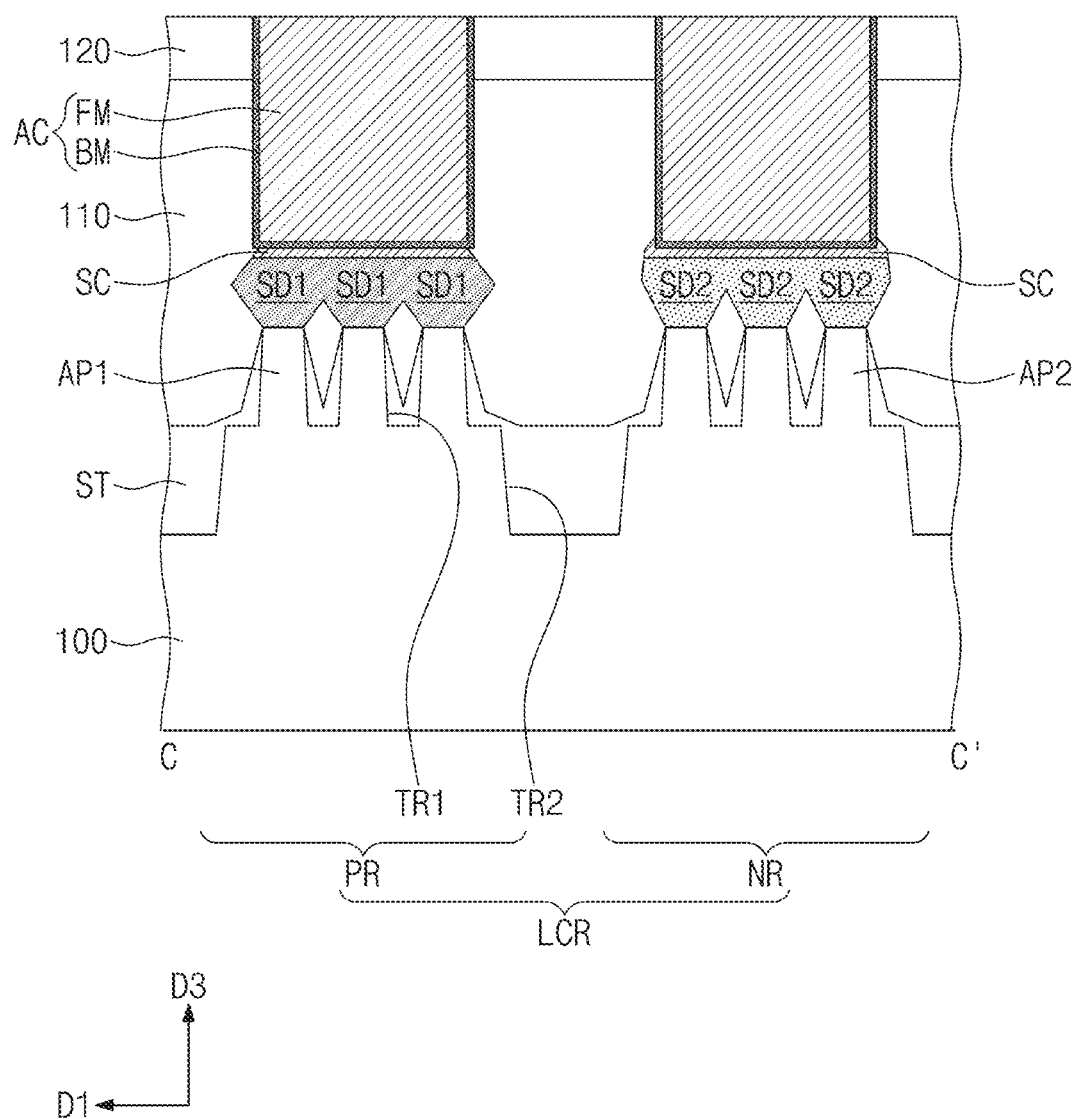
Figure 11D:
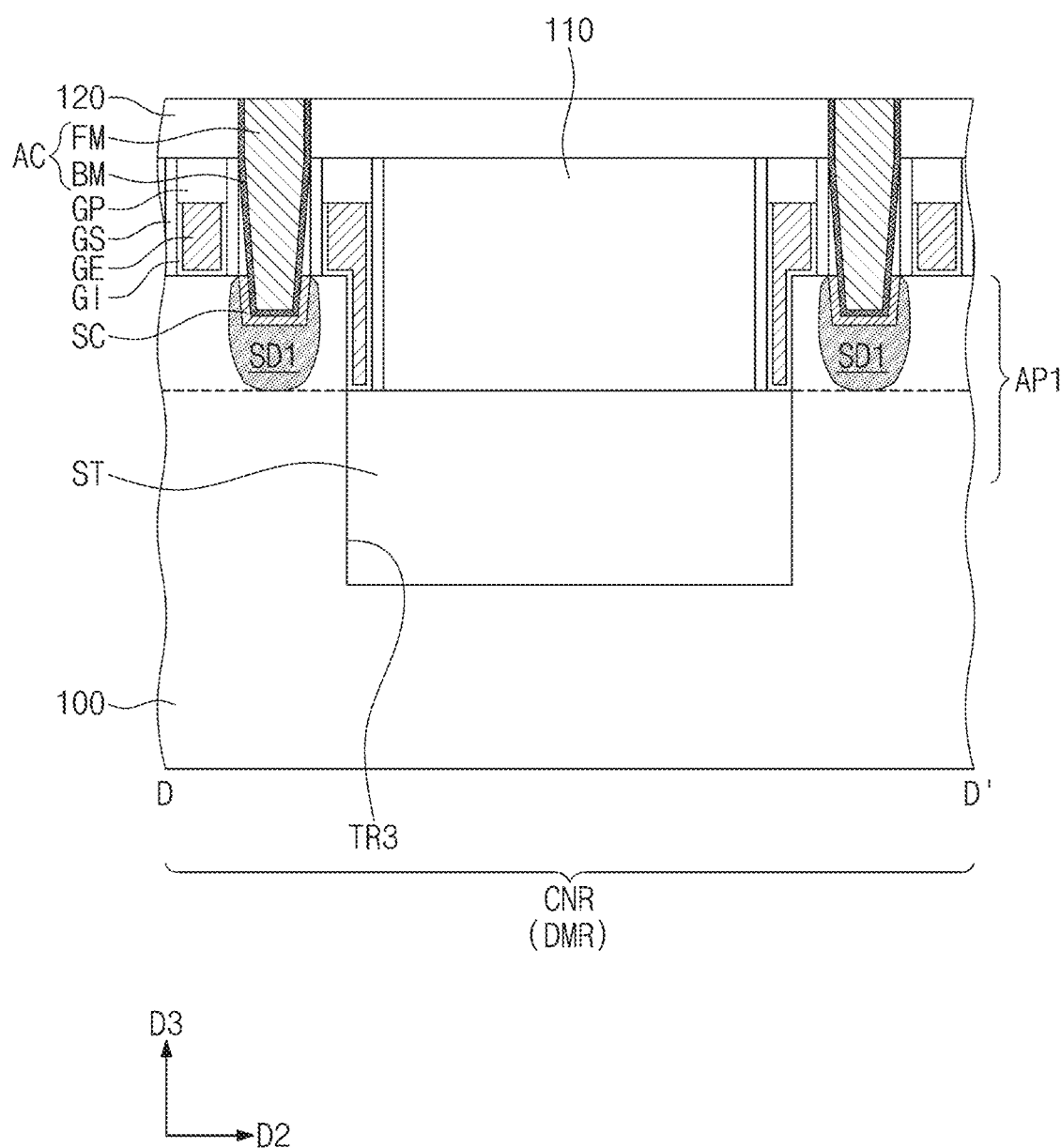

FIGS. 4, 6, 8, and 10 are plan views illustrating a method of fabricating a semiconductor device, according to an example embodiment of the inventive concepts. FIGS. 5A, 7A, 9A, and 11A are sectional views taken along lines A-A' of FIGS. 4, 6, 8, and 10, respectively. FIGS. 5B, 7B, 9B, and 11B are sectional views taken along lines B-B' of FIGS. 4, 6, 8, and 10, respectively. FIGS. 5C, 7C, 9C, and 11C are sectional views taken along lines C-C' of FIGS. 4, 6, 8, and 10, respectively. FIGS. 9D and 11D are sectional views taken along lines D-D' of FIGS. 8 and 10, respectively.

Referring to FIGS. 4 and 5A to 5C, the substrate 100 with the logic cell region LCR and the connection region CNR may be provided. For example, the logic cell region LCR may include the first and second active regions PR and NR.

The first and second active patterns AP1 and AP2 may be formed by patterning the substrate 100. The first and second active patterns AP1 and AP2 may be formed on the logic cell region LCR and the connection region CNR. In detail, the first active patterns AP1 may be formed on the first active region PR of the logic cell region LCR, and the second active patterns AP2 may be formed on the second active region NR of the logic cell region LCR.

The first trench TR1 may be formed between the first active patterns AP1 and between the second active patterns AP2. The first trench TR1 may be extended in the second direction D2 to be parallel to the first and second active patterns AP1 and AP2. The second trench TR2 may be formed between the first and second active regions PR and NR of the logic cell region LCR by patterning the substrate 100. The second trench TR2 may be extended in the second direction D2. The second trench TR2 may be formed to have a depth that is larger than that of the first trench TR1.

The substrate 100 may be patterned to form the third trench TR3 crossing the connection region CNR. The third trench TR3 may be extended in the first direction D1. Accordingly, the third trench TR3 may divide each of the first and second active patterns AP1 and AP2 into two portions. The third trench TR3 may have a depth that is equal to or greater than that of the second trench TR2.

The device isolation layer ST may be formed on the substrate 100 to fill the first to third trenches TR1, TR2, and TR3. The device isolation layer ST may be formed of or include an insulating material (e.g., silicon oxide). The device isolation layer ST may be recessed to expose upper portions of the first and second active patterns AP1 and AP2. For example, the upper portions of the first and second active patterns AP1 and AP2 may protrude vertically above the device isolation layer ST.

Referring to FIGS. 6 and 7A to 7C, sacrificial patterns PP may be formed to cross the first and second active patterns AP1 and AP2. The sacrificial patterns PP may be line- or bar-shaped patterns extending in the first direction D1. In detail, the formation of the sacrificial patterns PP may include forming a sacrificial layer on the substrate 100, forming hard mask patterns MA on the sacrificial layer, and patterning the sacrificial layer using the hard mask patterns MA as an etch mask. The sacrificial layer may be formed of or include polysilicon.

A pair of the gate spacers GS may be formed on both side surfaces of each of the sacrificial patterns PP. The formation of the gate spacers GS may include conformally forming a gate spacer layer on the substrate 100 and anisotropically etching the gate spacer layer. The gate spacer layer may be formed of or include at least one of SiCN, SiCON, or SiN. In certain embodiments, the gate spacer layer may be a multi-layer, which is formed of at least two of SiCN, SiCON, or SiN.

Referring to FIGS. 8 and 9A to 9D, the first source/drain patterns SD1 may be formed on an upper portion of the first active pattern AP1. A pair of the first source/drain patterns SD1 may be formed at two opposite portions of each of the sacrificial patterns PP.

In detail, first recess regions RSR1 may be formed by etching the upper portion of the first active pattern AP1 using the hard mask patterns MA and the gate spacers GS as an etch mask. The device isolation layer ST between the first active patterns AP1 may be recessed, during the etching of the upper portion of the first active pattern AP1 (e.g., see FIG. 9C).

The first source/drain pattern SD1 may be formed by a selective epitaxial growth process, in which an inner side surface of the first recess region RSR1 of the first active pattern AP1 is used as a seed layer. Since the first source/drain patterns SD1 are formed, the first channel pattern CH1 may be defined between each pair of the first source/drain patterns SD1. The selective epitaxial growth process may include a chemical vapor deposition (CVD) process or a molecular beam epitaxy (MBE) process. The first source/drain patterns SD1 may include a semiconductor material (e.g., SiGe) having a lattice constant greater than that of the semiconductor substrate 100. Each of the first source/drain patterns SD1 may be a multi-layered structure including a plurality of semiconductor layers.

As an example, during the selective epitaxial growth process, the first source/drain patterns SD1 may be doped in-situ with impurities. As another example, after the formation of the first source/drain patterns SD1, impurities may be injected into the first source/drain patterns SD1. The first source/drain patterns SD1 may be doped to have a first conductivity type (e.g., p-type).

The second source/drain patterns SD2 may be formed on the second active pattern AP2. A pair of the second source/drain patterns SD2 may be formed at both sides of each of the sacrificial patterns PP.

Figure 9A:
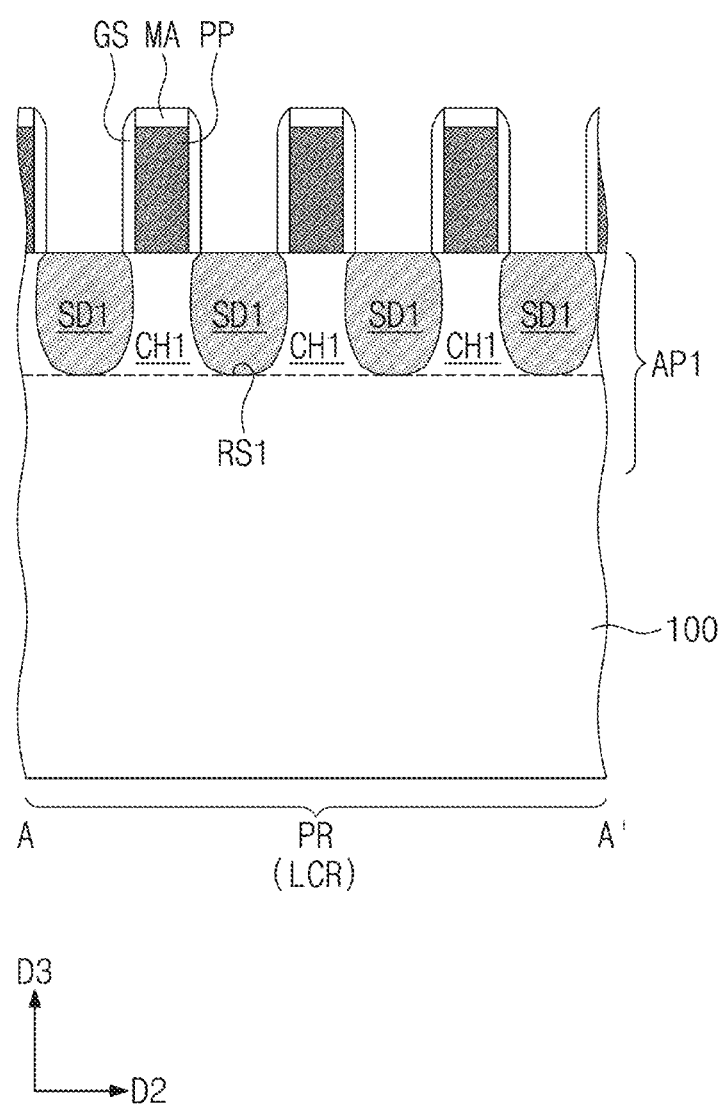
Figure 9B:
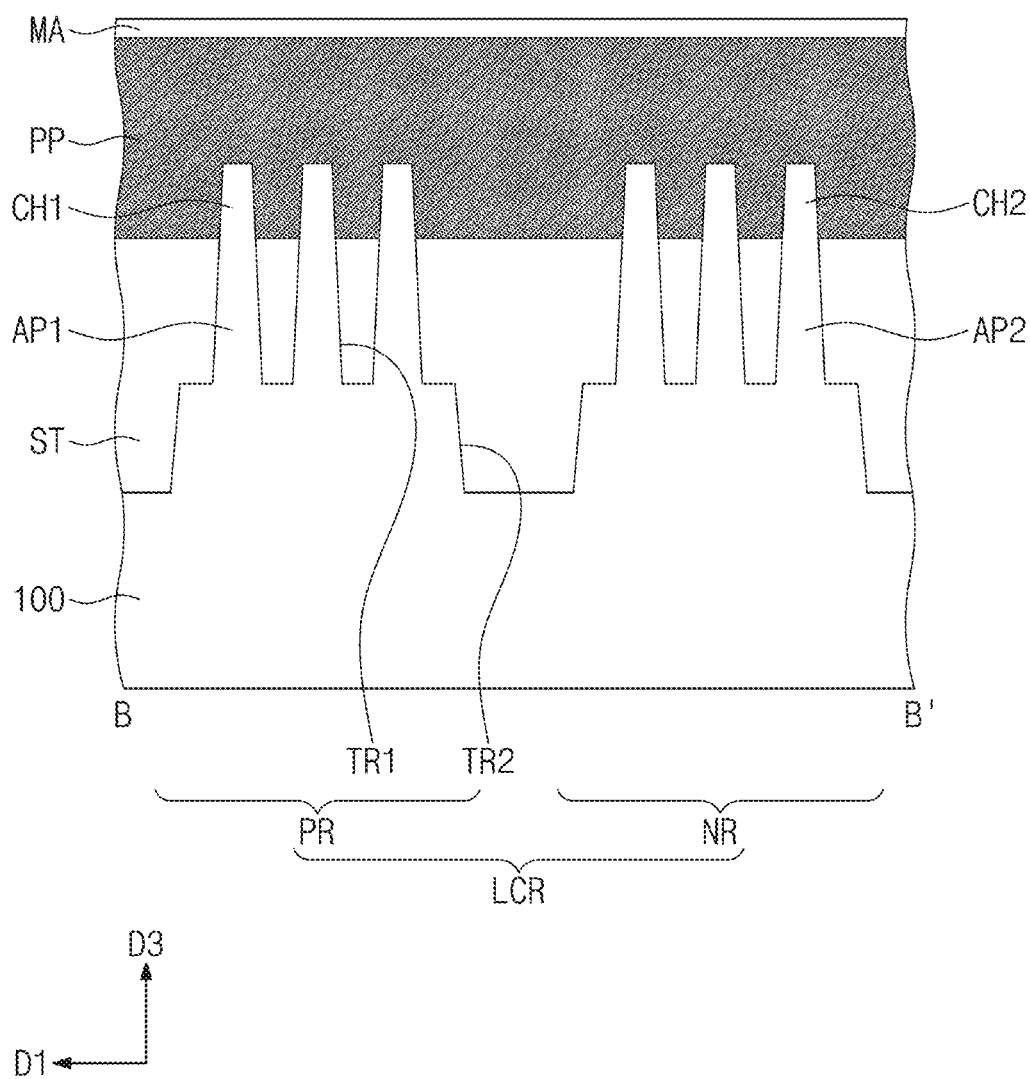
Figure 9C:
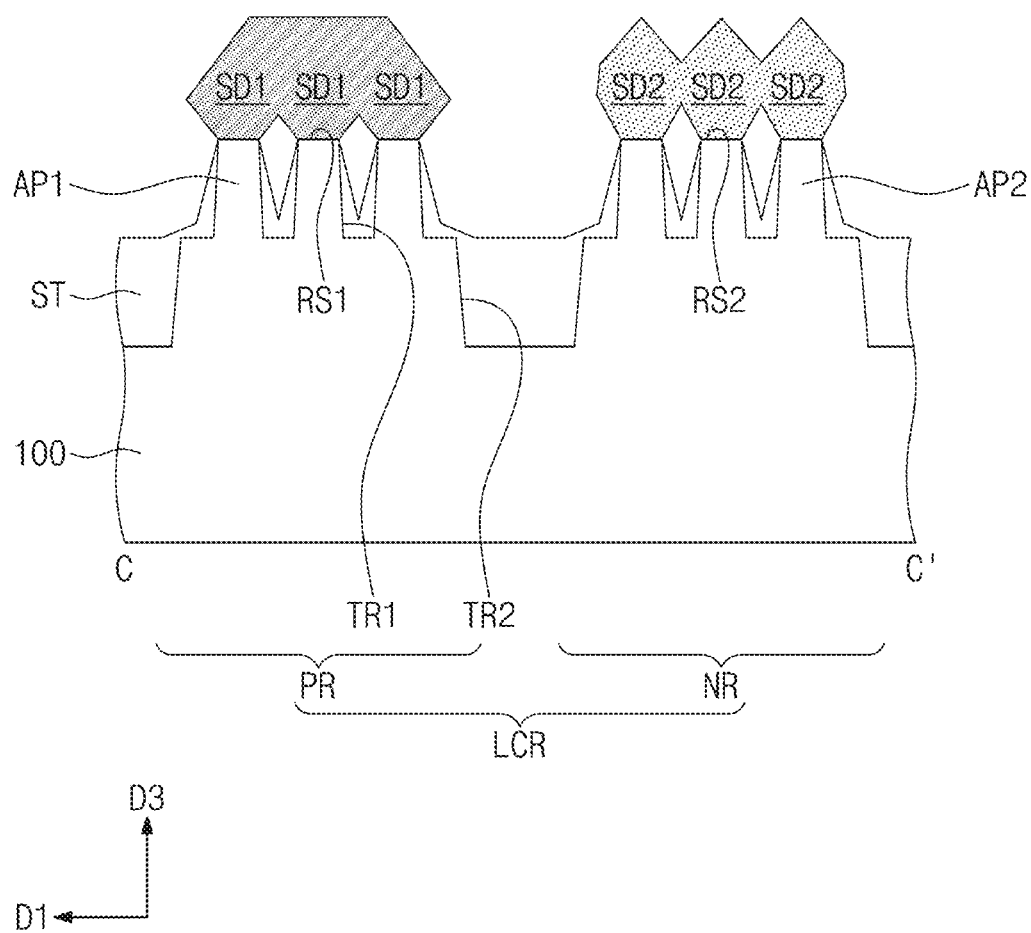
Figure 9D:
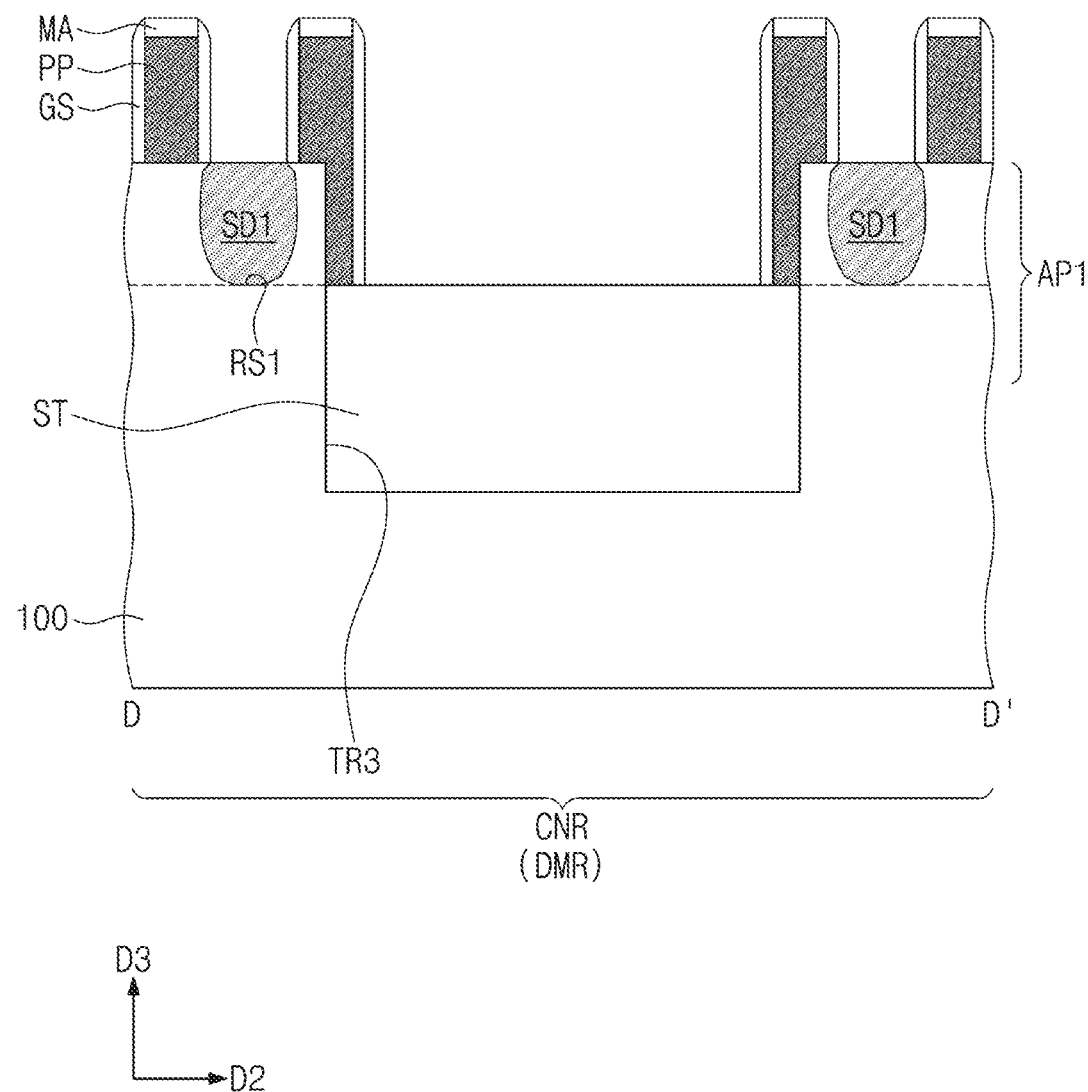
FIGS. 9D and 11D are sectional views taken along lines D-D' of FIGS. 8 and 10, respectively.
Figure 10:
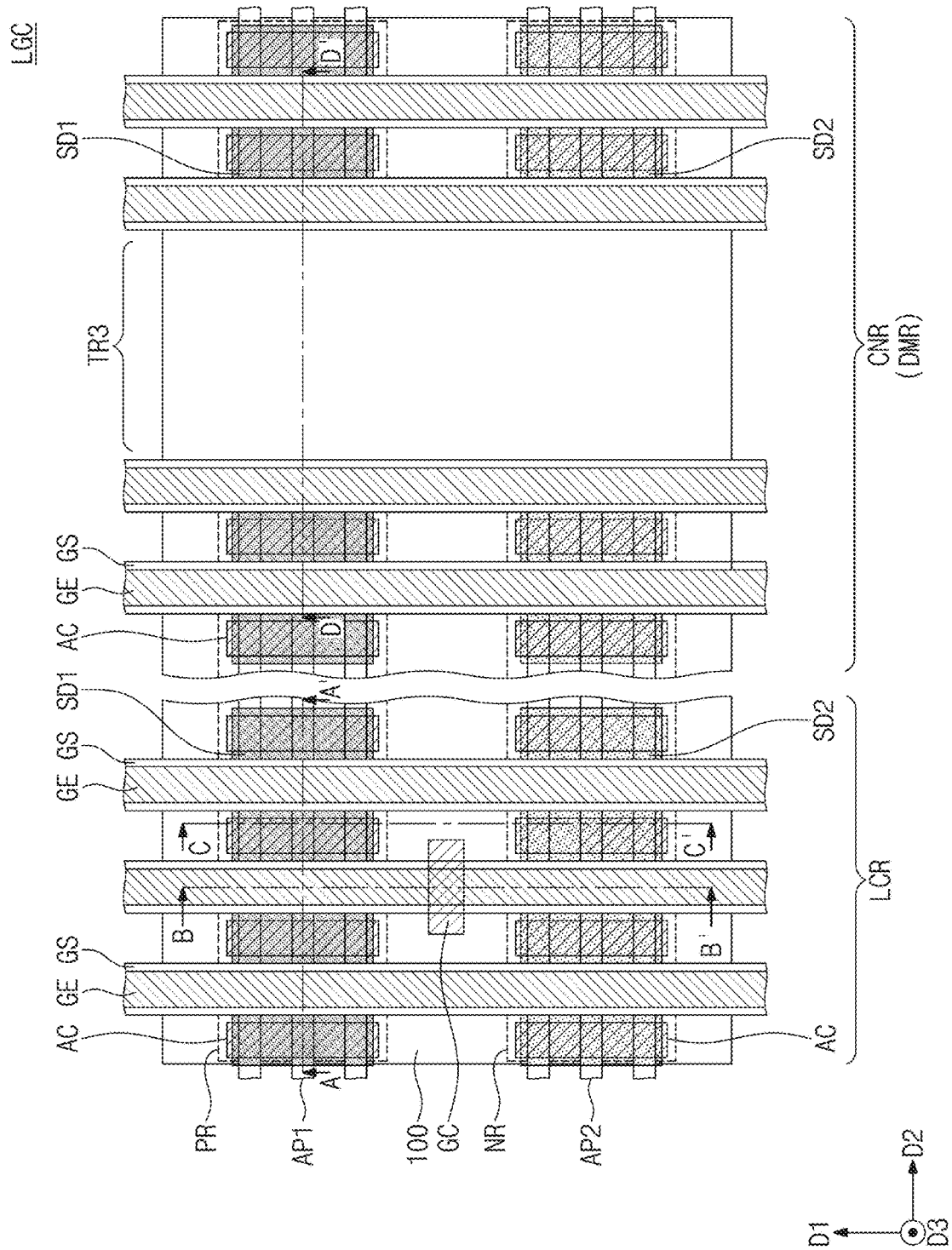

In detail, second recess regions RSR2 may be formed by etching an upper portion of the second active pattern AP2 using the hard mask patterns MA and the gate spacers GS as an etch mask (e.g., see FIG. 9C). The second source/drain pattern SD2 may be formed by a selective epitaxial growth process, in which an inner side surface of the second recess region RSR2 of the second active pattern AP2 is used as a seed layer. As a result of the formation of the second source/drain patterns SD2, the second channel pattern CH2 may be defined between each pair of the second source/drain patterns SD2. In an example embodiment, the second source/drain patterns SD2 may include the same semiconductor material (e.g., Si) as that of the substrate 100. The second source/drain patterns SD2 may be doped to have a second conductivity type (e.g., an n-type).

The first source/drain patterns SD1 and the second source/drain patterns SD2 may be sequentially formed by different processes. For example, the first source/drain patterns SD1 and the second source/drain patterns SD2 may not be formed at the same time. The first and second source/drain patterns SD1 and SD2 may be formed, in the same manner, on both of the logic cell region LCR and the connection region CNR.

Referring to FIGS. 10 and 11A to 11D, the first interlayer insulating layer 110 may be formed to cover the first and second source/drain patterns SD1 and SD2, the hard mask patterns MA, and the gate spacers GS. As an example, the first interlayer insulating layer 110 may be formed of or include silicon oxide.

The first interlayer insulating layer 110 may be planarized to expose the top surfaces of the sacrificial patterns PP. The planarization of the first interlayer insulating layer 110 may be performed using an etch-back or chemical-mechanical polishing (CMP) process. During the planarization process, all of the hard mask patterns MA may be removed. As a result, the first interlayer insulating layer 110 may have a top surface that is substantially coplanar with the top surfaces of the sacrificial patterns PP and the top surfaces of the gate spacers GS.

The sacrificial patterns PP may be replaced with the gate electrodes GE, respectively. For example, the exposed sacrificial patterns PP may be selectively removed. As a result of the removal of the sacrificial patterns PP, empty spaces may be formed. The gate dielectric pattern GI, the gate electrode GE, and the gate capping pattern GP may be formed in each of the empty spaces. The gate electrode GE may include a first metal pattern and a second metal pattern on the first metal pattern. The first metal pattern may be formed of a work function metal capable of adjusting a threshold voltage of a transistor, and the second metal pattern may be formed of a low resistance metal.

The second interlayer insulating layer 120 may be formed on the first interlayer insulating layer 110. The second interlayer insulating layer 120 may be formed of or include silicon oxide. The active contacts AC may be formed to penetrate the second interlayer insulating layer 120 and the first interlayer insulating layer 110 and to be electrically connected to the first and second source/drain patterns SD1 and SD2. The gate contact GC may be formed to penetrate the second interlayer insulating layer 120 and the gate capping pattern GP and to be electrically connected to the gate electrode GE.

Referring back to FIGS. 2 and 3A to 3E, the third interlayer insulating layer 130 may be formed on the second interlayer insulating layer 120. The connection patterns CNP may be formed in the third interlayer insulating layer 130. The connection patterns CNP may be formed on the active contacts AC and the gate contact GC, respectively.

The fourth interlayer insulating layer 140 may be formed on the third interlayer insulating layer 130. The first metal layer M1 may be formed in the fourth interlayer insulating layer 140. The formation of the first metal layer M1 may include forming the vias VI using a damascene process and forming the interconnection lines INL on the vias VI using a damascene process.

Before the forming of the fourth interlayer insulating layer 140 and the first metal layer M1, at least one through contact TCT may be formed on the connection region CNR. The process of forming the active contacts AC, the gate contacts GC, and the connection patterns CNP thereon may be a middle-of-line (MOL) process. The process of forming the first metal layer M1 and the additional metal layers thereon may be a back-end-of-line (BEOL) process. The through contact TCT may be formed between the MOL process and the BEOL process.

FIGS. 12 to 17 are sectional views illustrating a method of forming a through contact, according to an example embodiment of the inventive concepts. Hereinafter, the method of forming the through contact TCT will be described in more detail with reference to FIGS. 12 to 17.

Figure 12:
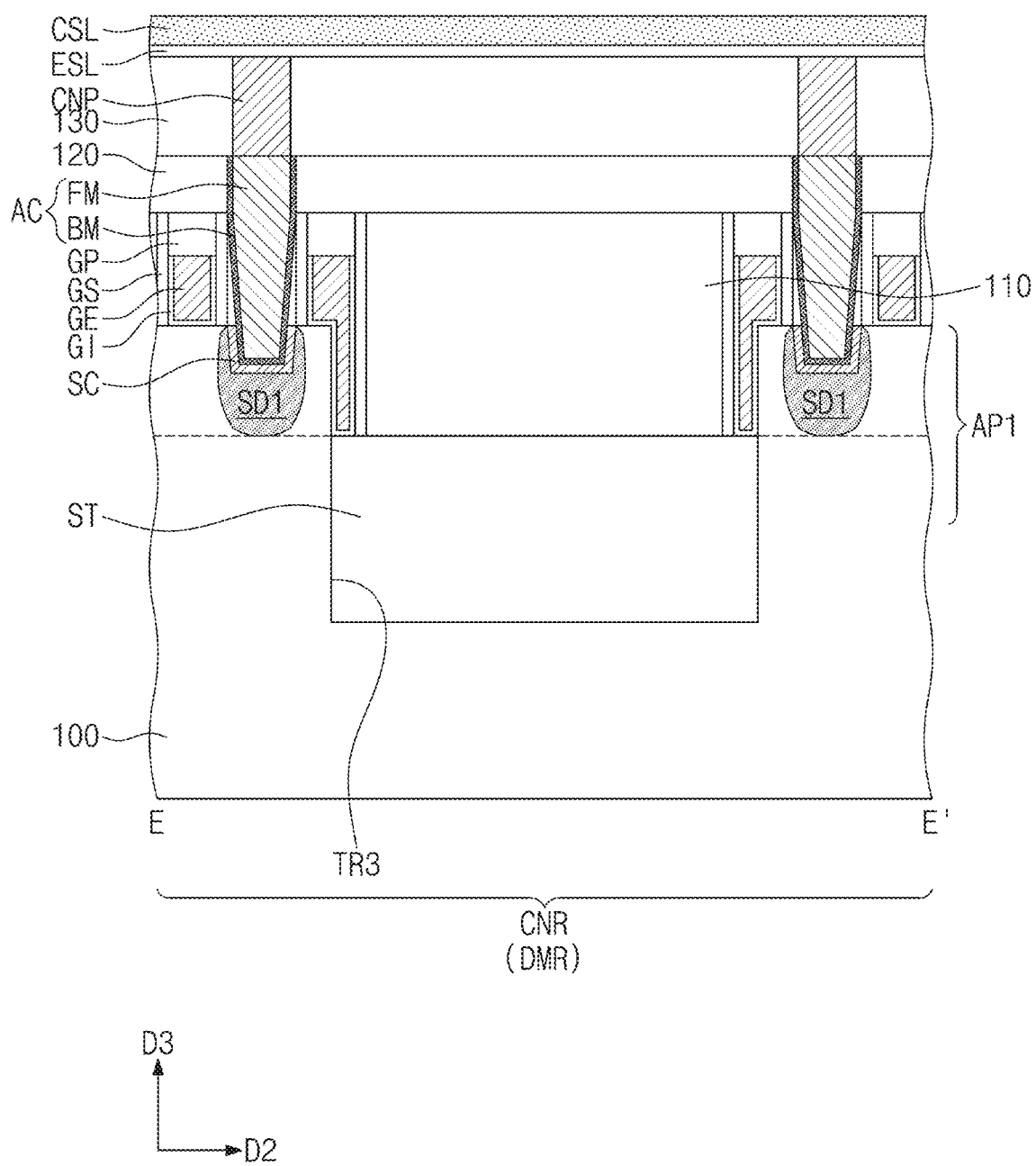
FIGS. 12 to 17 are sectional views illustrating a method of forming a through contact, according to an example embodiment of the inventive concepts.

Referring to FIG. 12, the etch stop layer ESL and a planarization stop layer CSL may be sequentially formed on the third interlayer insulating layer 130, after the MOL process. The planarization stop layer CSL may be used as a stop layer in a planarization process to be described below and may be formed of or include at least one of SiN, SiCN, or SiON. The etch stop layer ESL may be formed of or include a material having an etch selectivity with respect to the planarization stop layer CSL. For example, the etch stop layer ESL may include a silicon oxide layer.

Figure 13:
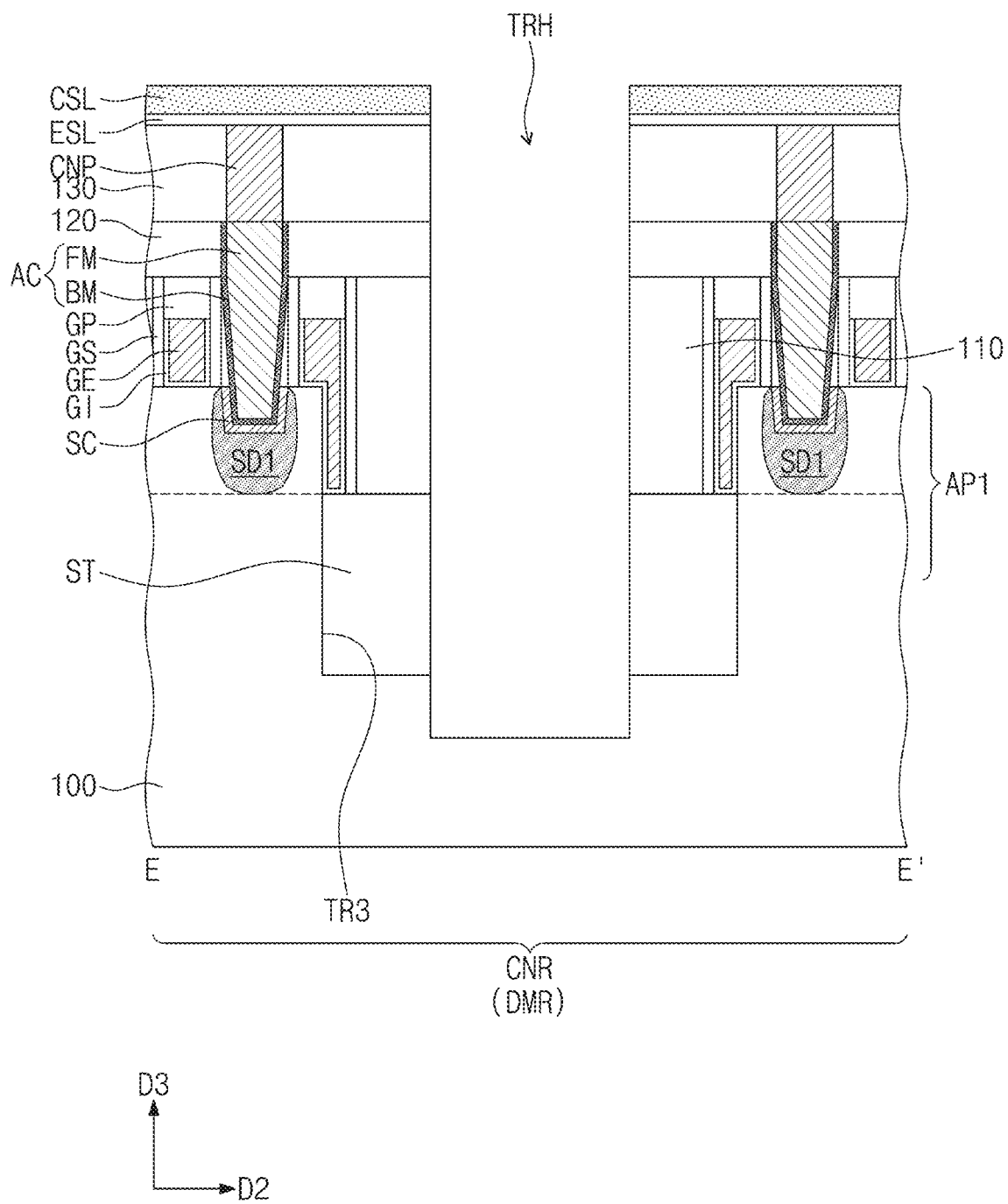

Referring to FIG. 13, a penetration hole TRH may be formed on the device isolation layer ST of the connection region CNR. In detail, an anisotropic etching process may be performed on the planarization stop layer CSL to form the penetration hole TRH penetrating the first to third interlayer insulating layers 110, 120, and 130 and the device isolation layer ST. The penetration hole TRH may be extended toward the bottom surface of the substrate 100 to penetrate an upper portion of the substrate 100. The penetration hole TRH may not penetrate the substrate 100 completely.

Figure 14:
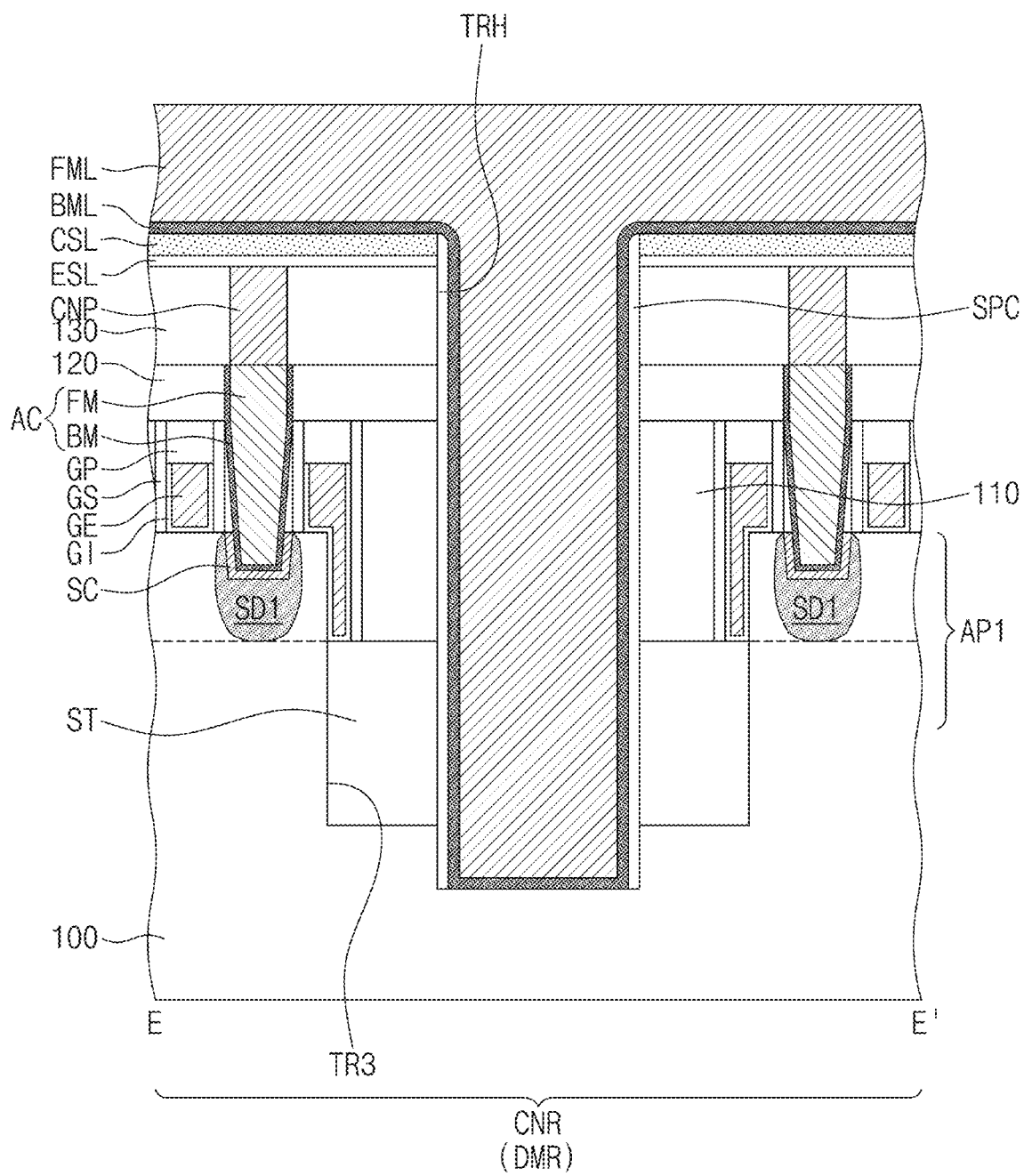

Referring to FIG. 14, the insulating spacer SPC may be formed on an inner side surface of the penetration hole TRH. In detail, the formation of the insulating spacer SPC may include conformally forming an insulating layer in the penetration hole TRH and anisotropically etching the insulating layer.

A barrier layer BML and a conductive layer FML may be sequentially formed to fill the penetration hole TRH. The barrier layer BML may be conformally formed in the penetration hole TRH. The barrier layer BML may include a metal nitride layer or may include a metal layer and a metal nitride layer. The conductive layer FML may be formed to completely fill the penetration hole TRH. The conductive layer FML may be formed of or include low resistance metal (e.g., copper).

Figure 15:
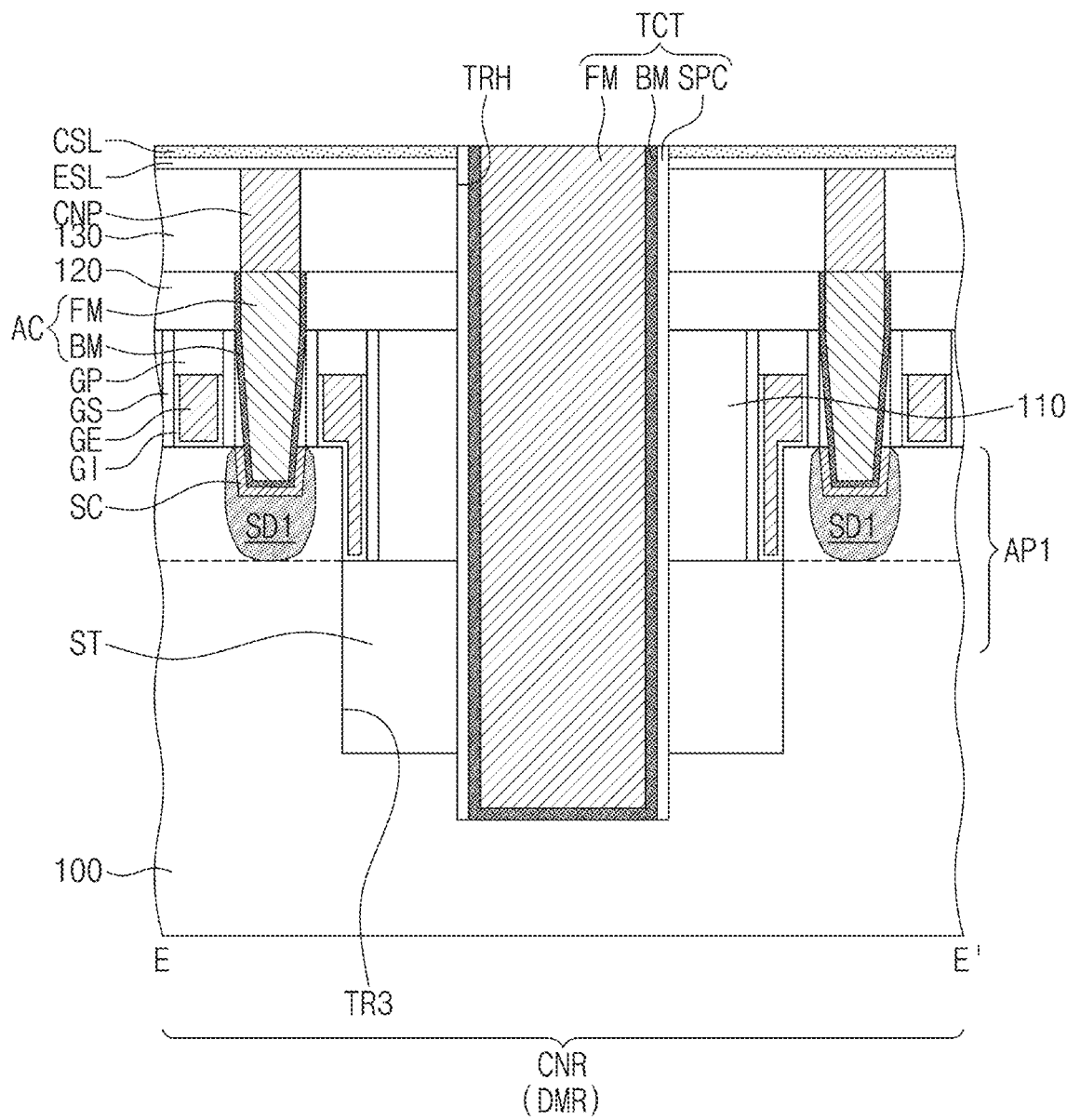

Referring to FIG. 15, the through contact TCT may be formed by performing a planarization process on the conductive layer FML. The planarization process may be performed to expose the planarization stop layer CSL. As a result of the planarization process, the barrier layer BML and the conductive layer FML on the planarization stop layer CSL may be completely removed.

The insulating spacer SPC, the barrier pattern BM, and the conductive pattern FM may be left in the penetration hole TRH. They may include the through contact TCT. A top surface of the insulating spacer SPC, a top surface of the barrier pattern BM, a top surface of the conductive pattern FM, and a top surface of the planarization stop layer CSL may be coplanar with each other by the planarization process.

Figure 16:
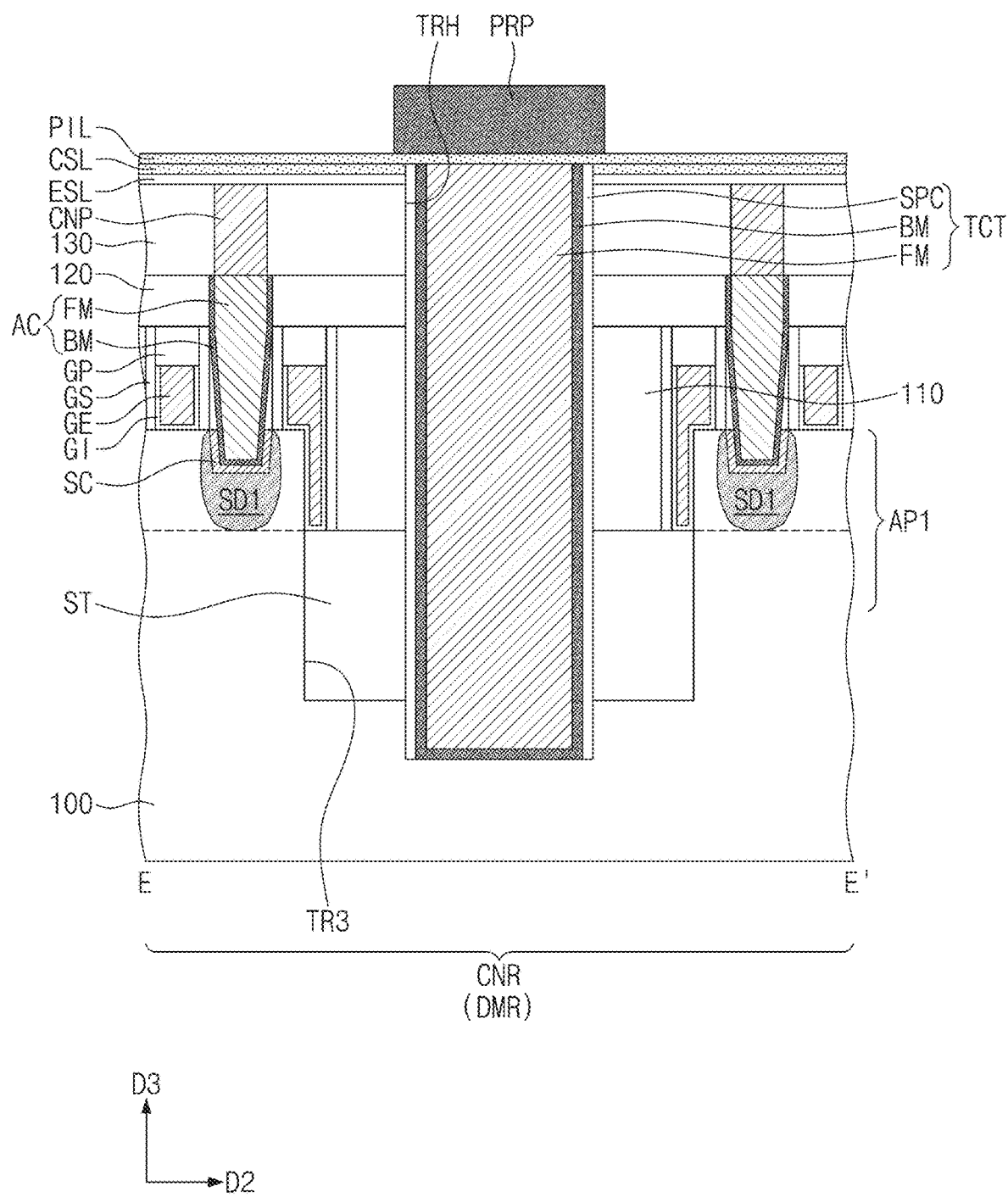

Referring to FIG. 16, a protection insulating layer PIL may be formed on the planarization stop layer CSL and the through contact TCT. The protection insulating layer PIL may include at least one of SiN, SiCN, or SiON. In an example embodiment, the protection insulating layer PIL may be formed of or include the same material as the planarization stop layer CSL.

A photoresist pattern PRP may be formed to be vertically overlapped with the through contact TCT. The photoresist pattern PRP may locally cover a region of the protection insulating layer PIL on the through contact TCT and may expose other region of the protection insulating layer PIL.

Figure 17:
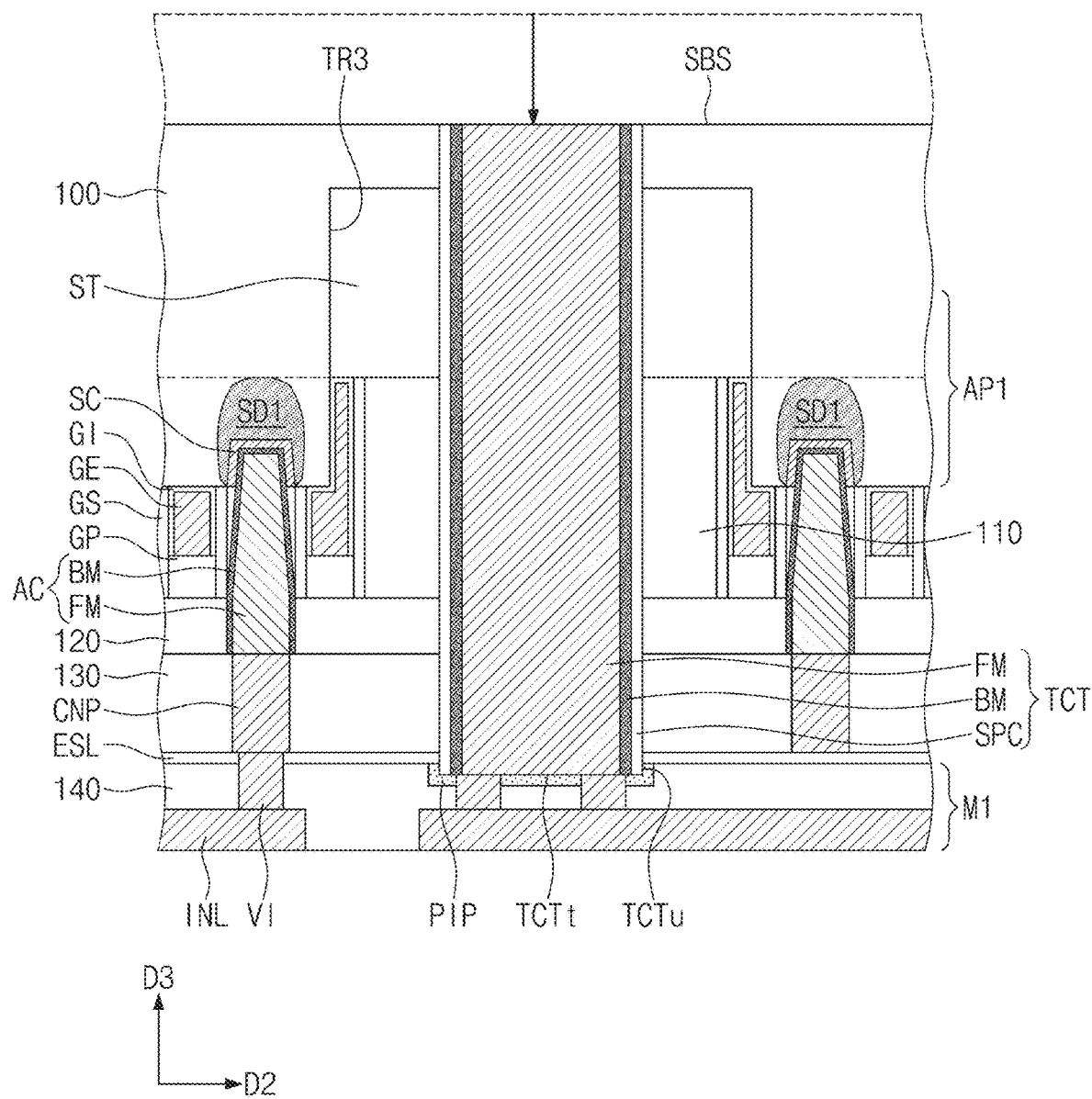

Referring to FIG. 17, the protection insulating layer PIL and the planarization stop layer CSL may be etched using the photoresist pattern PRP as an etch mask. The etching process may be performed to expose the etch stop layer ESL. A portion of the protection insulating layer PIL and a portion of the planarization stop layer CSL, which are located below the photoresist pattern PRP, may not be etched during the etching process. The remaining portion of the protection insulating layer PIL and the remaining portion of the planarization stop layer CSL may include the protection insulating pattern PIP. The protection insulating pattern PIP may cover the top surface TCTt of the through contact TCT and the upper side surface TCTu of the through contact TCT. The protection insulating pattern PIP may passivate an exposed portion of the through contact TCT.

Thereafter, a BEOL process may be performed on the etch stop layer ESL to form at least one metal layer (e.g., the first metal layer M1). After the BEOL process, the substrate 100 may be inverted and then a planarization process may be performed on a bottom surface SBS of the substrate 100.

As a result of the planarization process, a thickness of the substrate 100 may be reduced. The planarization process may be performed to expose the through contact TCT. As a result of the planarization process, the conductive pattern FM of the through contact TCT may be exposed through the bottom surface SBS of the substrate 100.

Figure 3A:
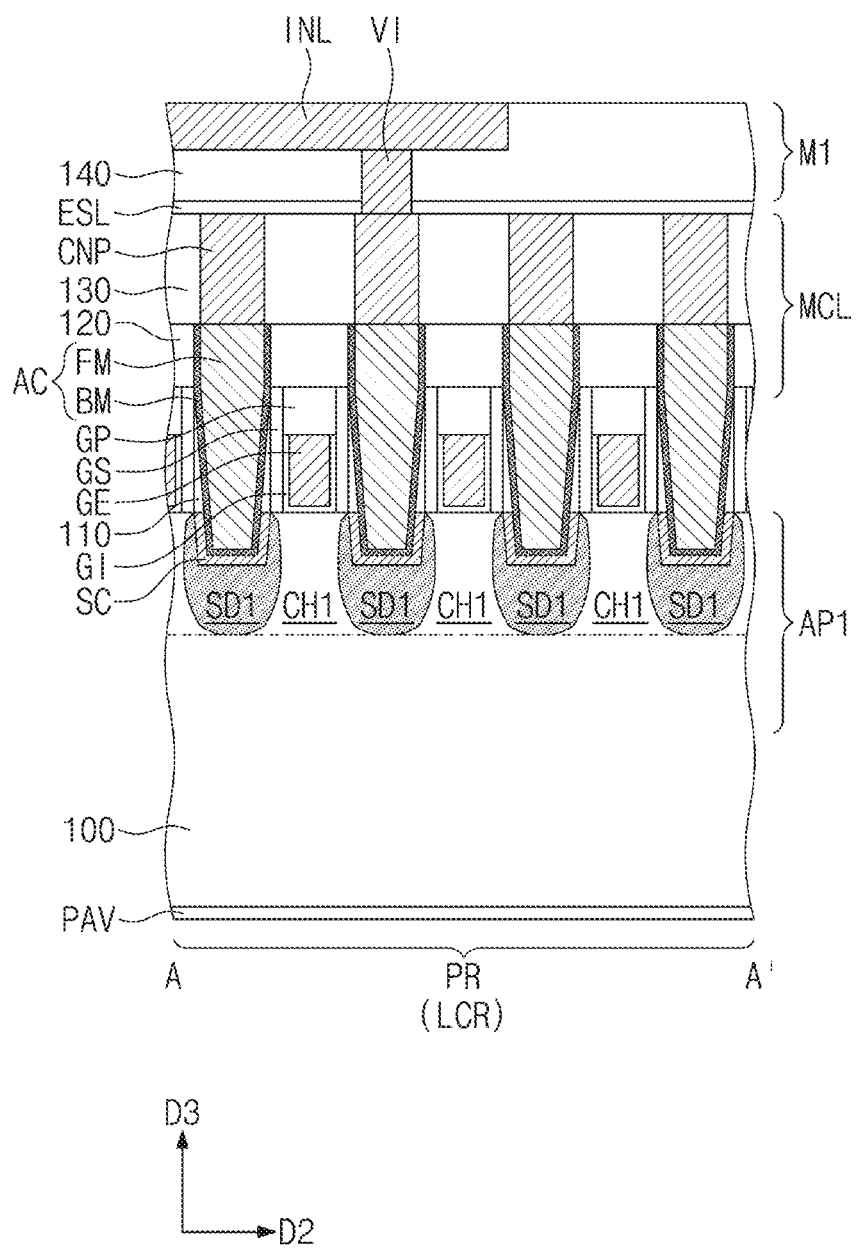
FIGS. 3A to 3E are sectional views taken along lines A-A', B-B', C-C', D-D', and E-E', respectively, of FIG. 2.
Figure 3B:
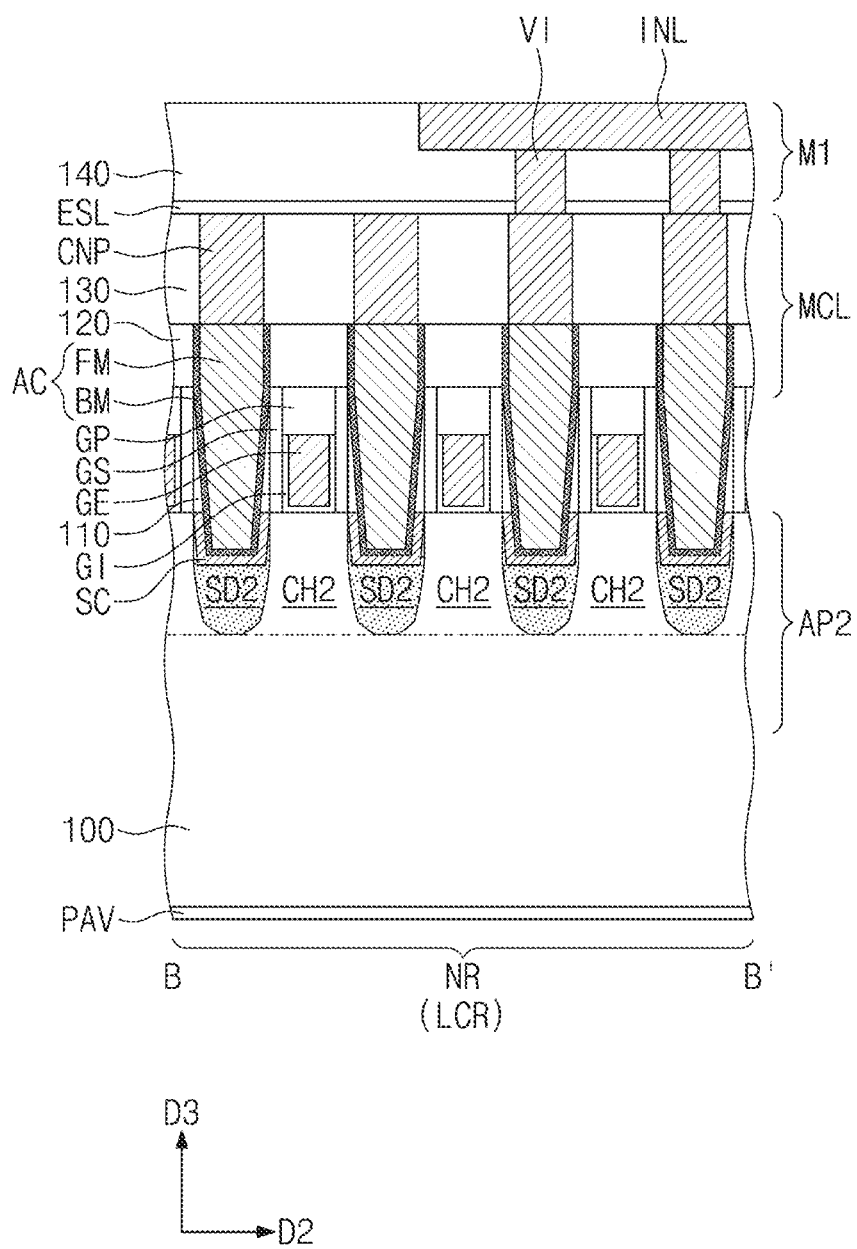
Figure 3C:
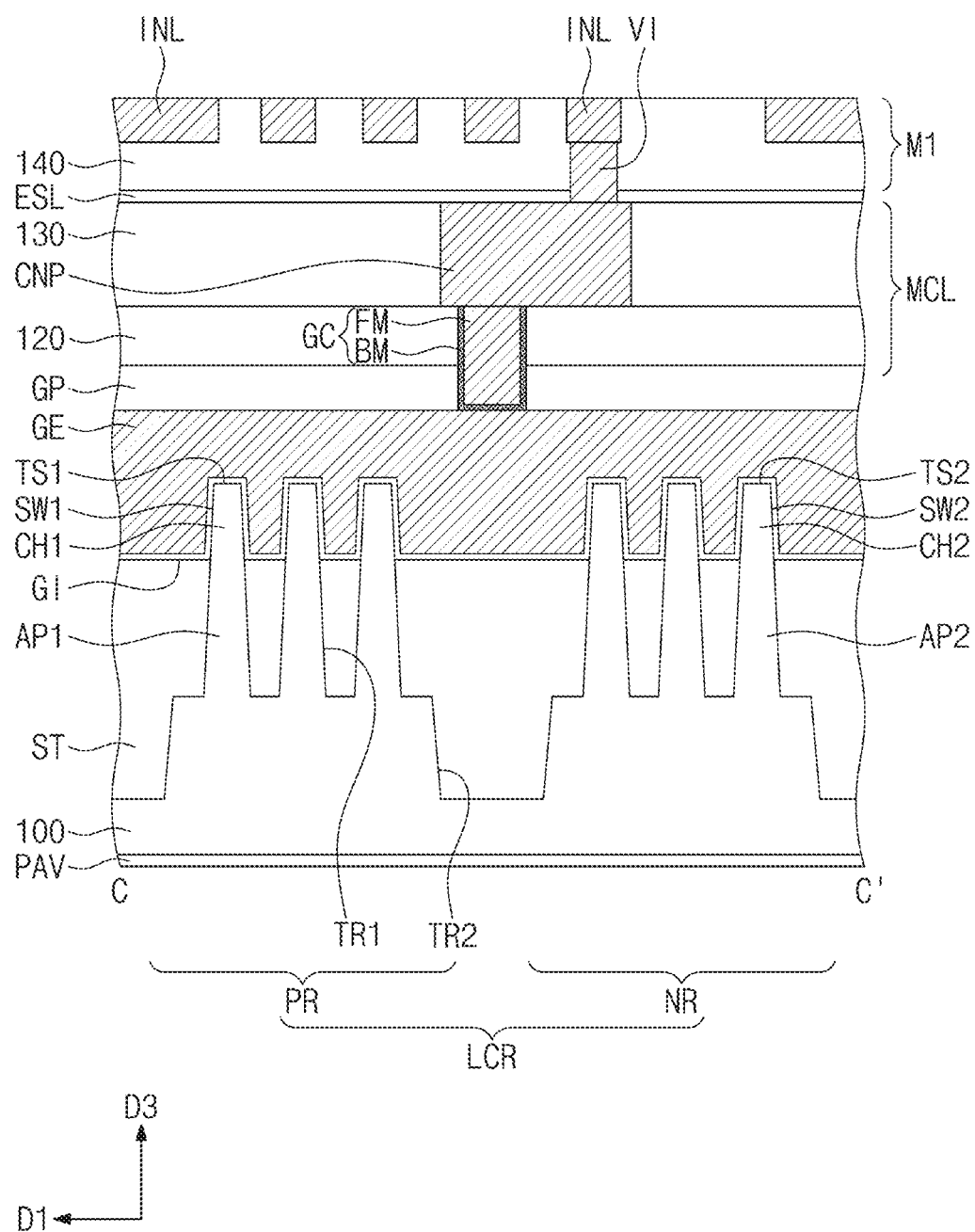
Figure 3D:
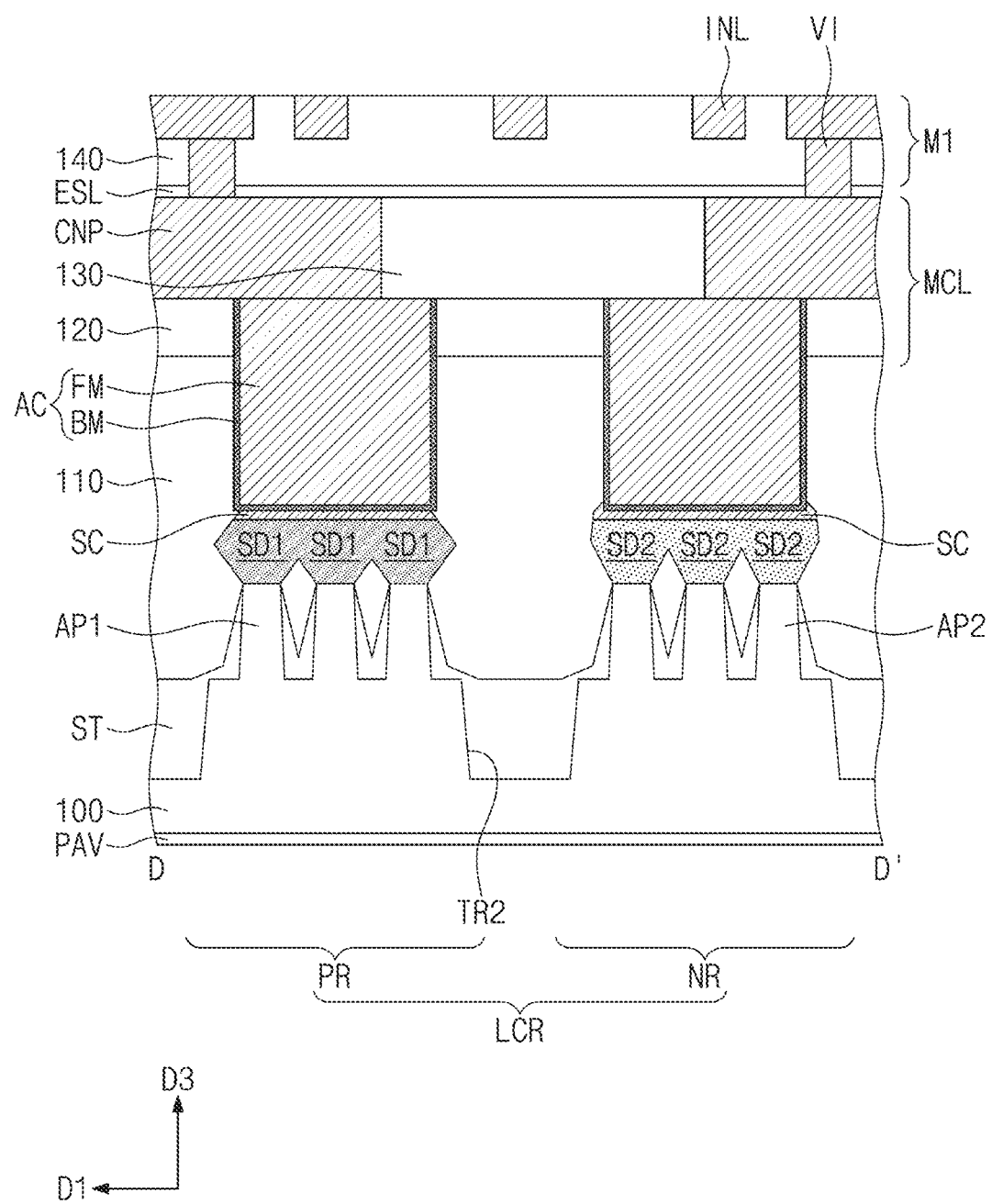
Figure 3E:
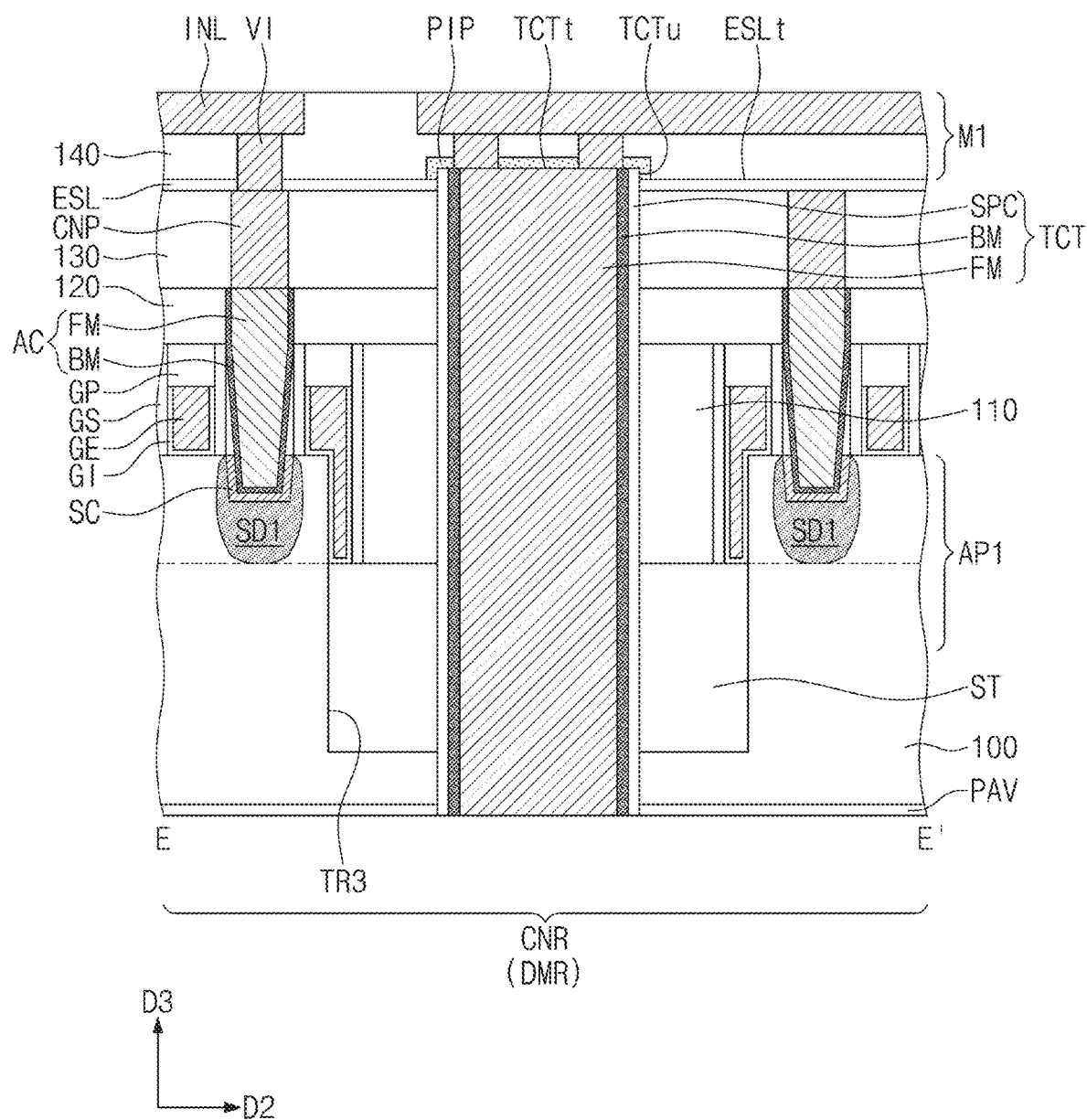
Figure 4:
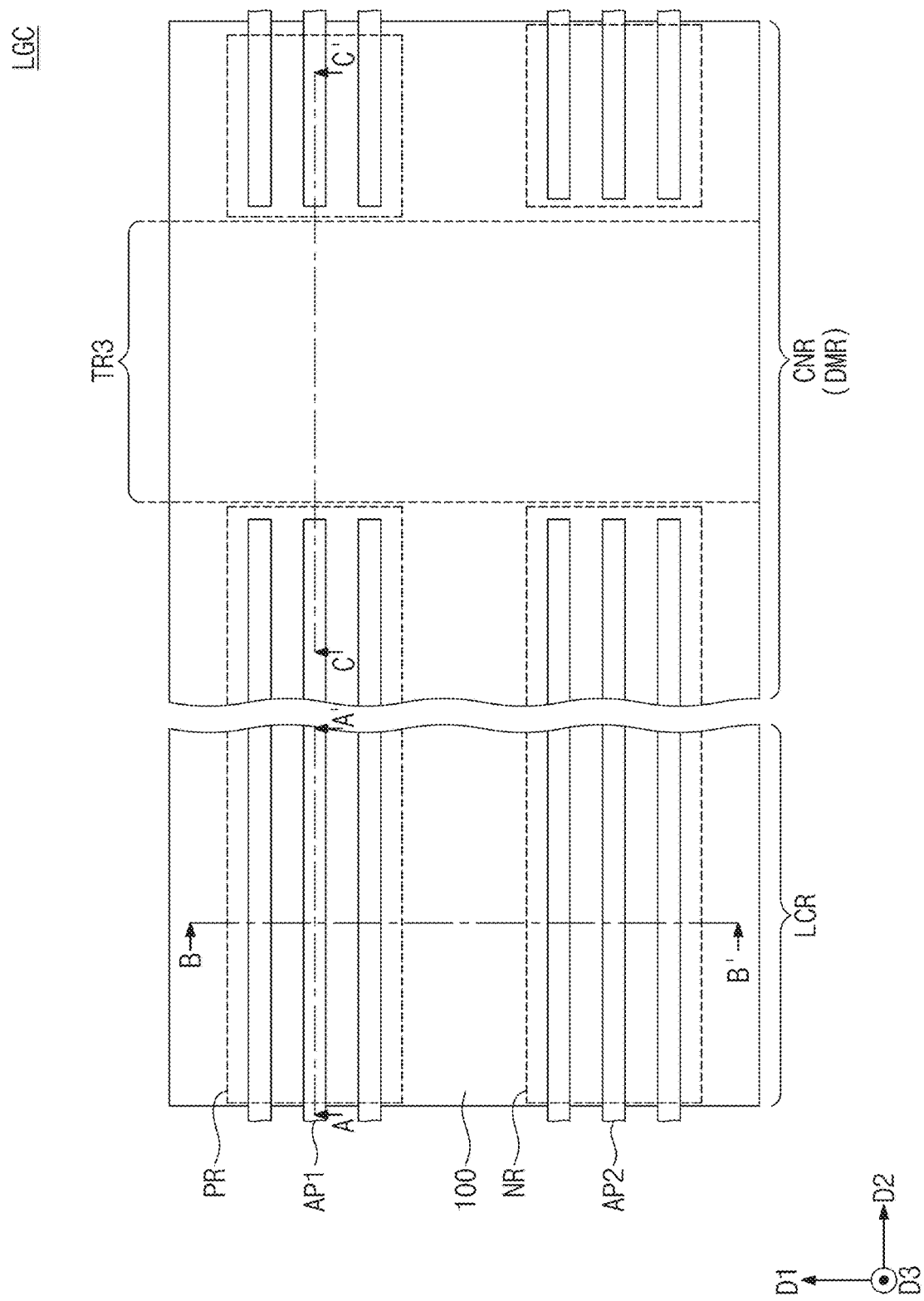
FIGS. 4, 6, 8, and 10 are plan views illustrating a method of fabricating a semiconductor device, according to an example embodiment of the inventive concepts.
Figure 5A:
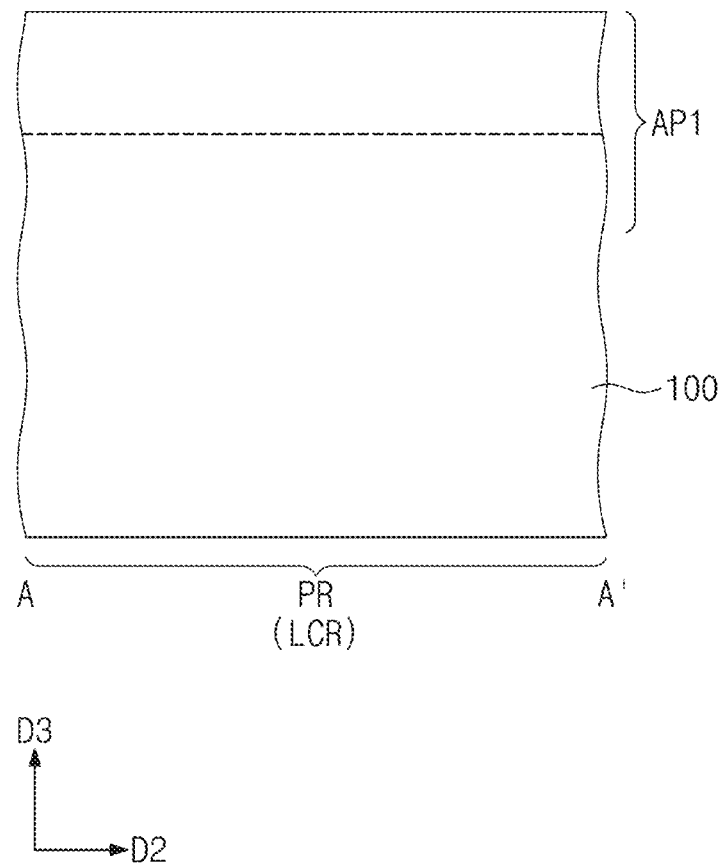
FIGS. 5A, 7A, 9A, and 11A are sectional views taken along lines A-A' of FIGS. 4, 6, 8, and 10, respectively.
Figure 5B:
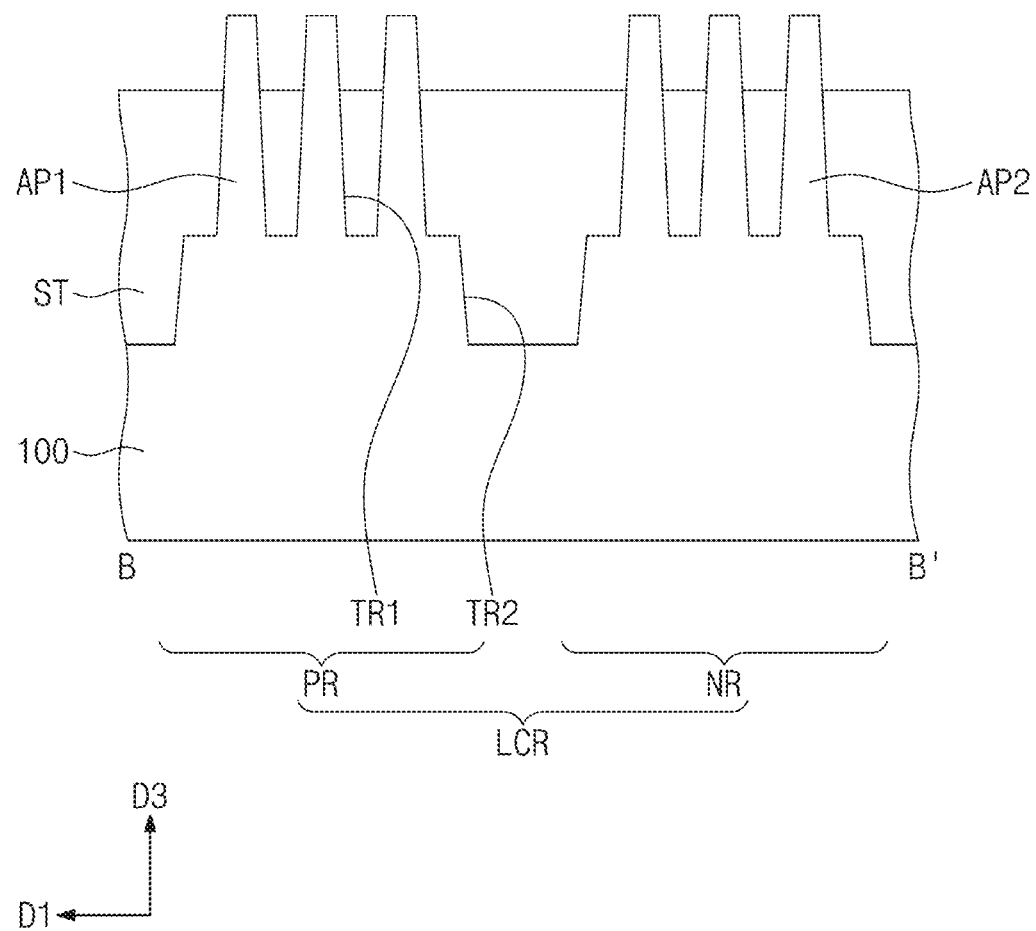
FIGS. 5B, 7B, 9B, and 11B are sectional views taken along lines B-B' of FIGS. 4, 6, 8, and 10, respectively.
Figure 5C:
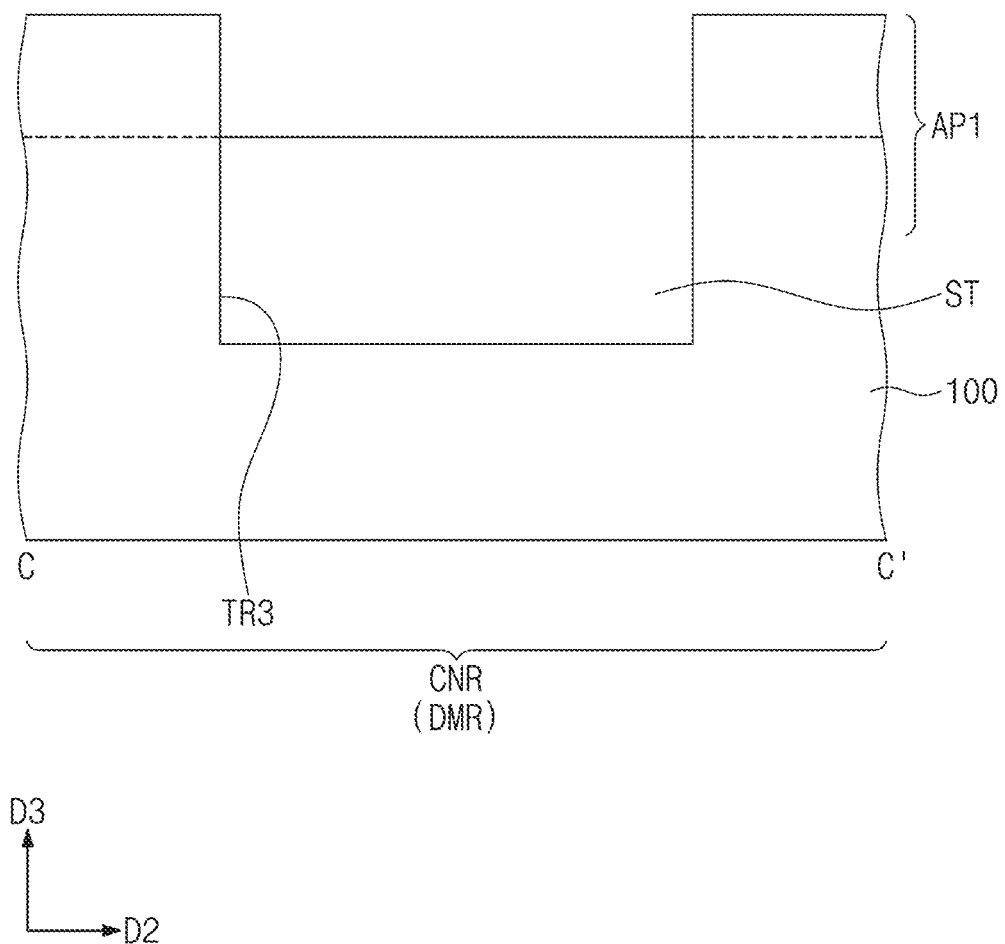
FIGS. 5C, 7C, 9C, and 11C are sectional views taken along lines C-C' of FIGS. 4, 6, 8, and 10, respectively.
Figure 6:
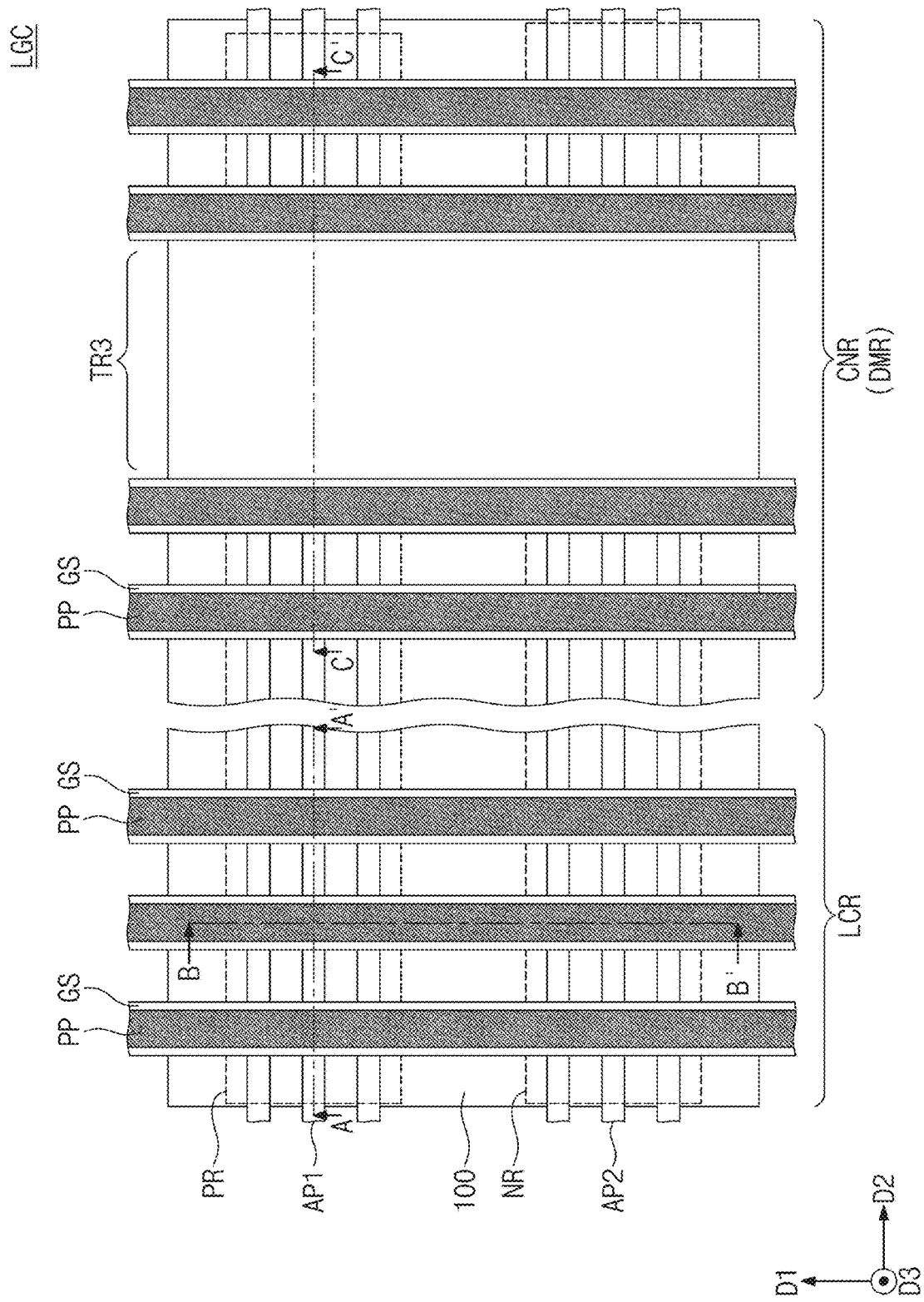
Figure 7A:
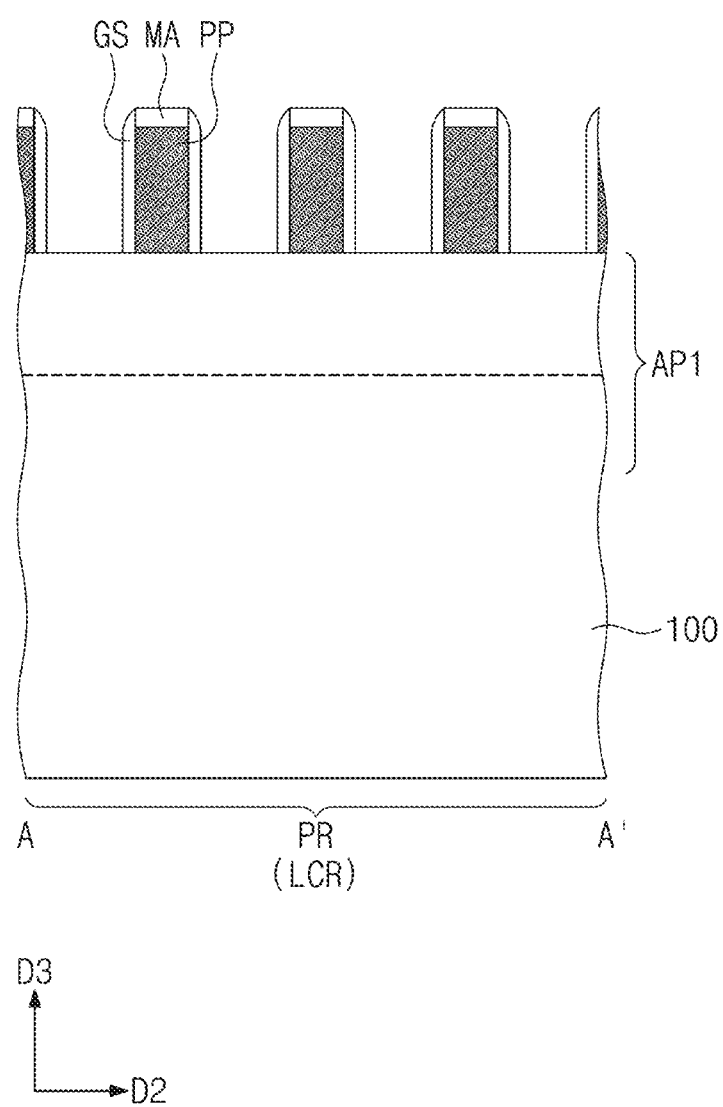
Figure 7B:
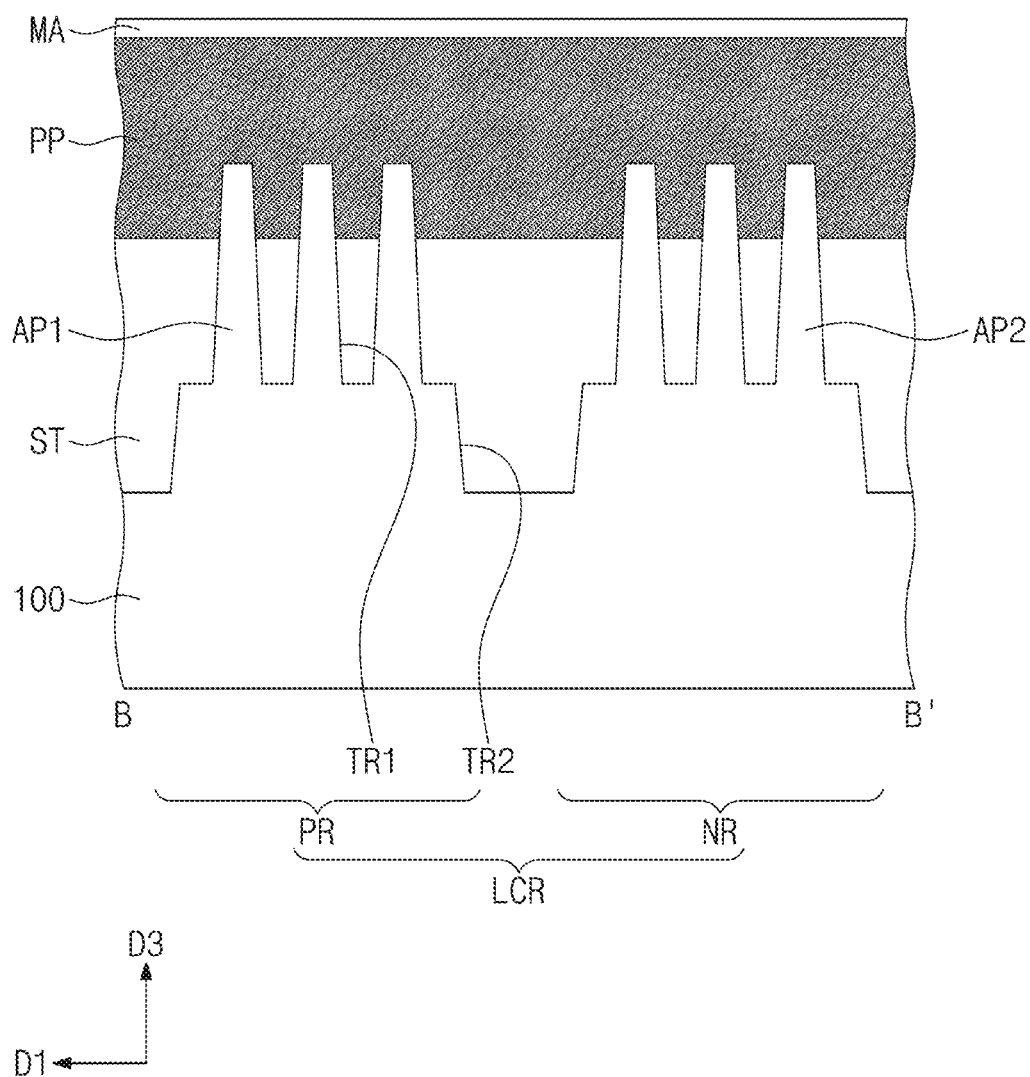
Figure 7C:
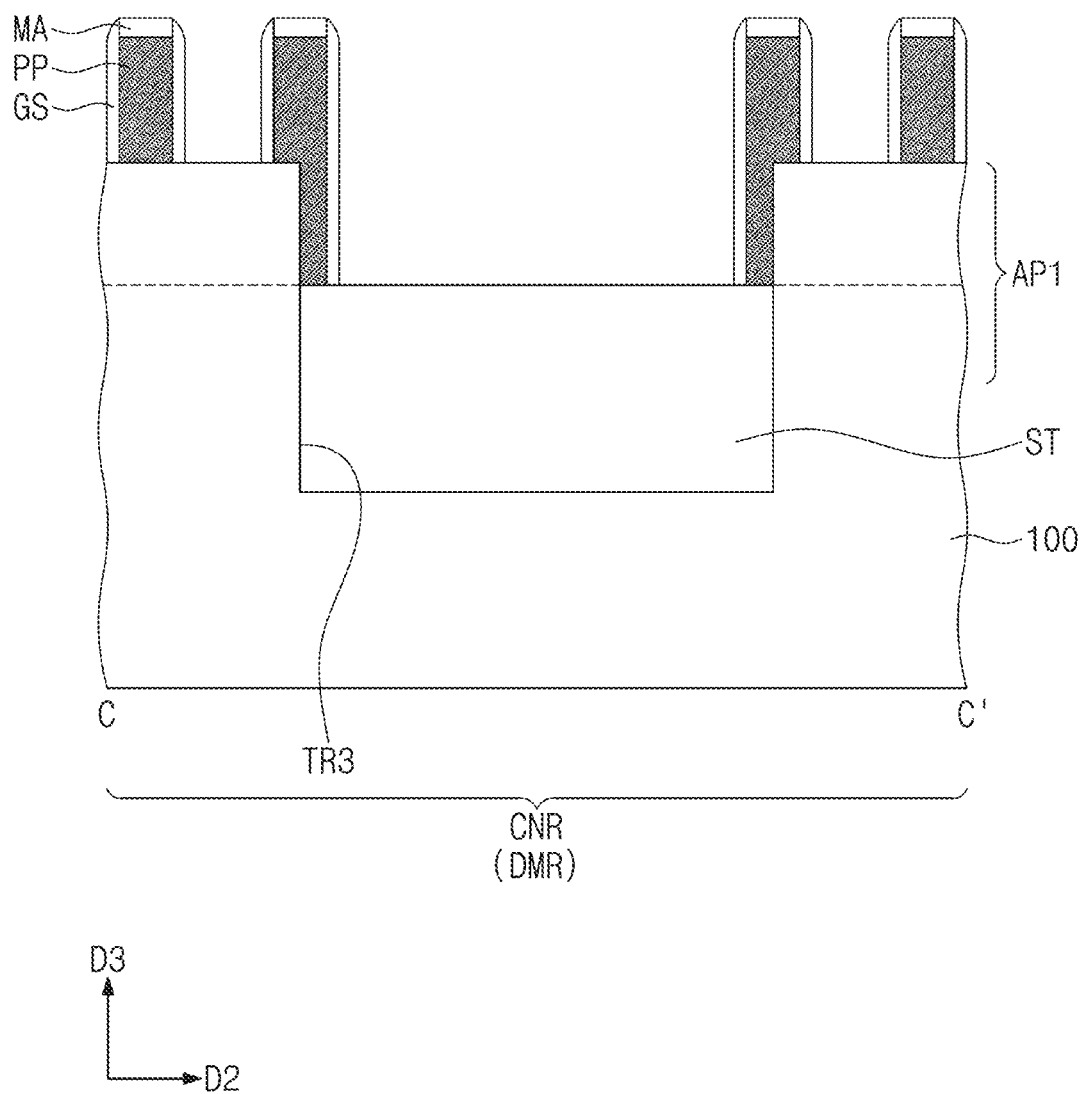
Figure 8:
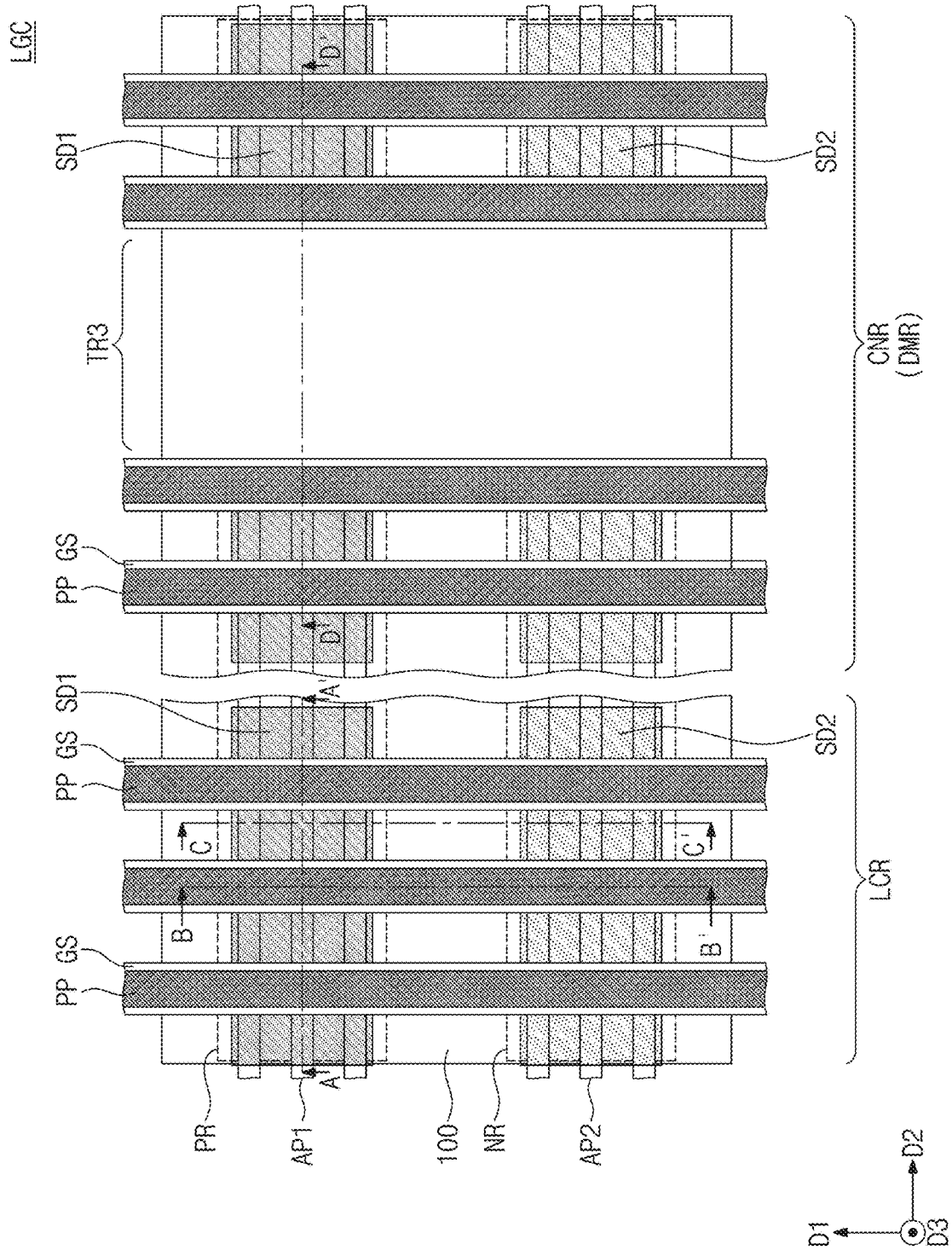

Thereafter, as shown in FIG. 3E, a passivation process may be performed on the through contact TCT exposed through the bottom surface SBS of the substrate 100 to form the passivation layer PAV.

In the method of forming the through contact TCT according to an example embodiment of the inventive concepts, the through contact TCT may be stably formed, without, or with a reduced risk of, a process defect issue, through combination of the etch stop layer ESL and the planarization stop layer CSL. Especially, the etch stop layer ESL may protect the connection patterns CNP thereunder, during the formation of the through contact TCT. Furthermore, the remaining portion of the planarization stop layer CSL may be used as the protection insulating pattern PIP protecting an upper portion of the through contact TCT.

Figure 18:
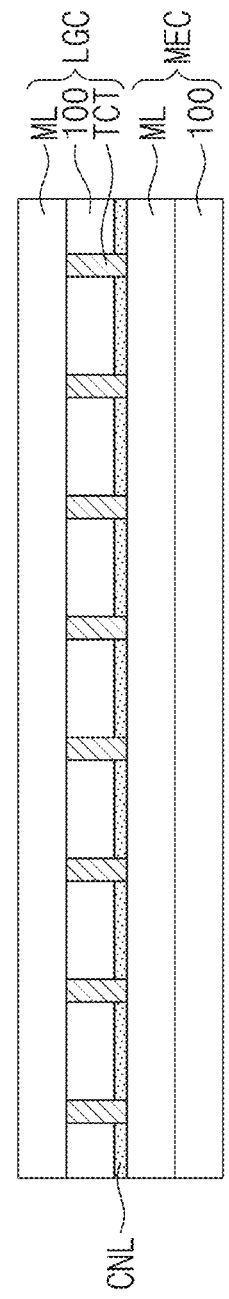
FIG. 18 is a sectional view illustrating a stack of semiconductor chips according to an example embodiment of the inventive concepts.

FIG. 18 is a sectional view illustrating a stack of semiconductor chips according to an example embodiment of the inventive concepts. For concise description, an element previously described with reference to FIGS. 1, 2, and 3A to 3E will be identified by the same reference number without repeating an overlapping description thereof, and features different from that of the previous embodiment will be described in more detail below.

Referring to FIG. 18, a memory chip MEC and the logic chip LGC, which is stacked on the memory chip MEC, may be provided. The logic chip LGC of FIG. 18 may be the logic chip LGC described with reference to FIGS. 1, 2, and 3A to 3E. The logic chip LGC may include the substrate 100, on which integrated circuits are formed, and a metal layer ML, which is disposed on the substrate 100. The metal layer ML may include a plurality of metal layers and, for example, may include the first metal layer M1 described above. The logic chip LGC may include at least one through contact TCT, which is extended downward from the metal layer ML to penetrate the substrate 100.

Similar to the logic chip LGC, the memory chip MEC may include the substrate 100, on which memory cells are provided, and the metal layer ML, which is disposed on the substrate 100. For example, the memory chip MEC may be a DRAM chip or a SRAM chip. The metal layer ML of the memory chip MEC may be electrically connected to the through contact TCT.

A connection layer CNL may be provided between the memory chip MEC and the logic chip LGC. The connection layer CNL may attach the memory chip MEC to the logic chip LGC. Although not shown, a connection pad (e.g., a micro bump) may be provided in the connection layer CNL to connect the through contact TCT of the logic chip LGC to the metal layer ML of the memory chip MEC.

Figure 19:
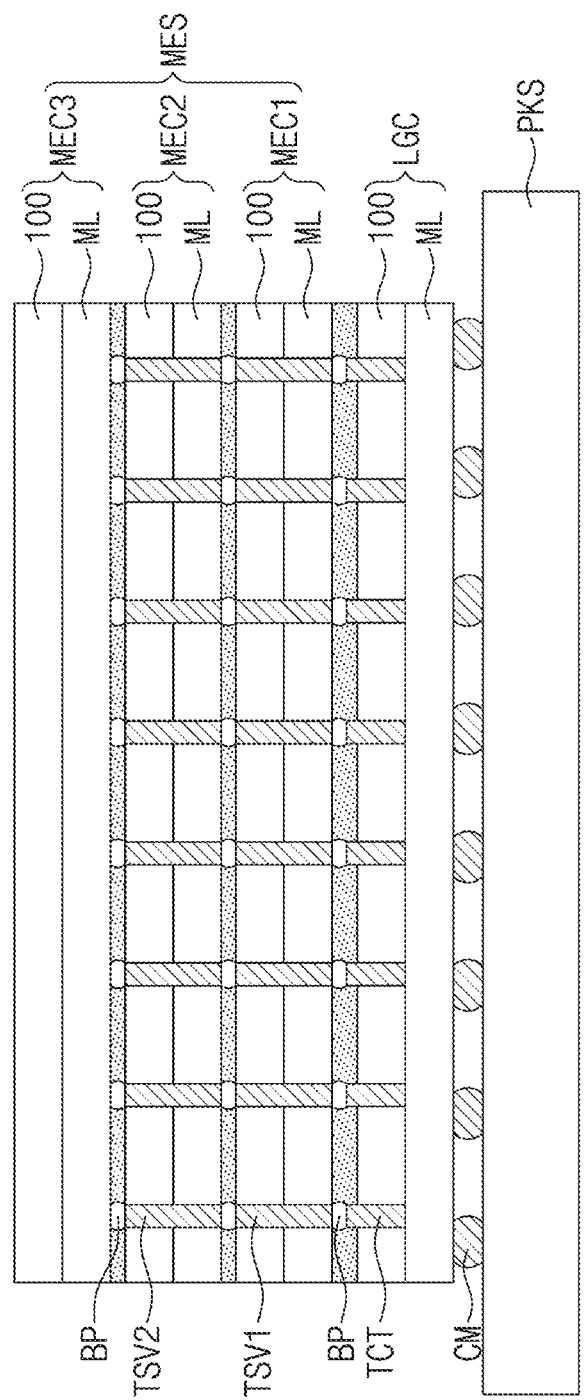
FIG. 19 is a sectional view illustrating a semiconductor package according to an example embodiment of the inventive concepts.
Figure 20A:
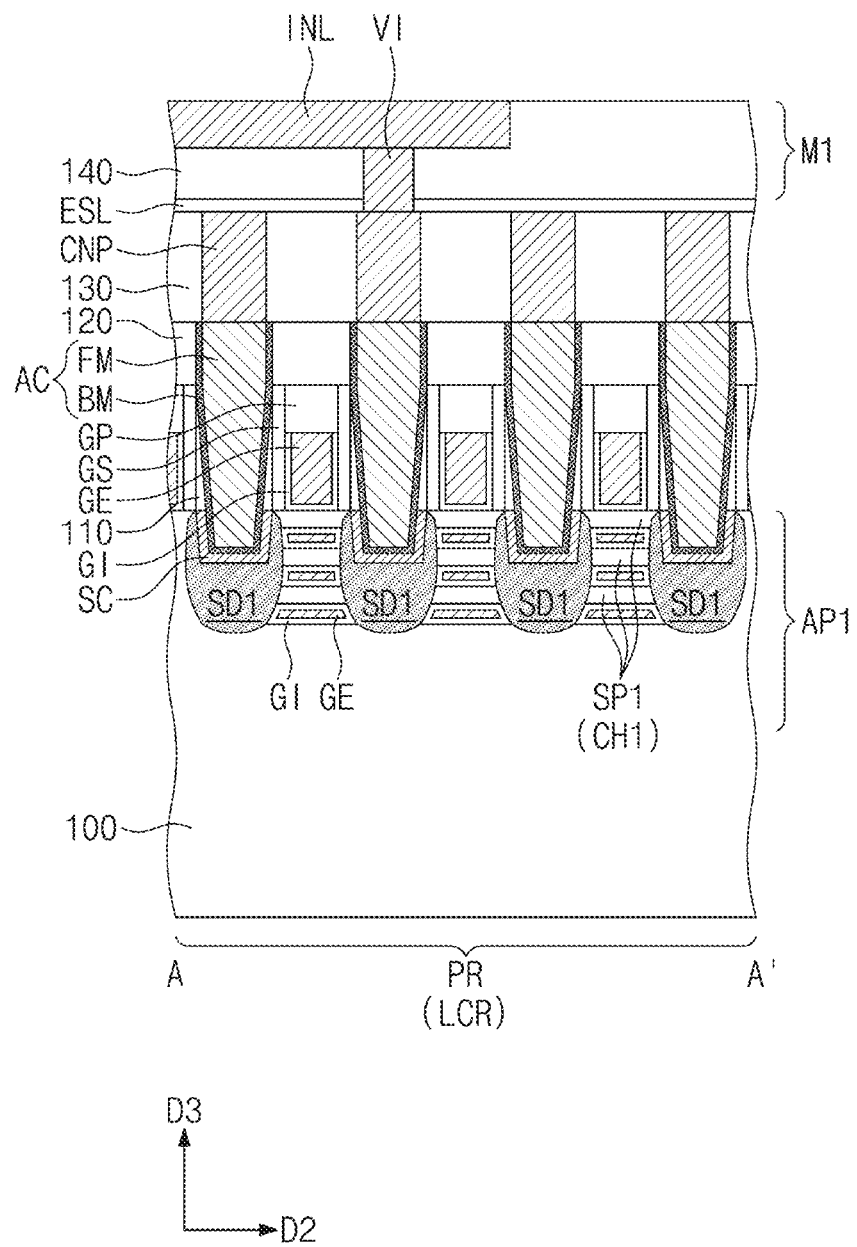
FIGS. 20A to 20E are sectional views, which are taken along the lines A-A', B-B', C-C', D-D', and E-E', respectively, of FIG. 2 to illustrate a semiconductor device according to an example embodiment of the inventive concepts.
Figure 20B:
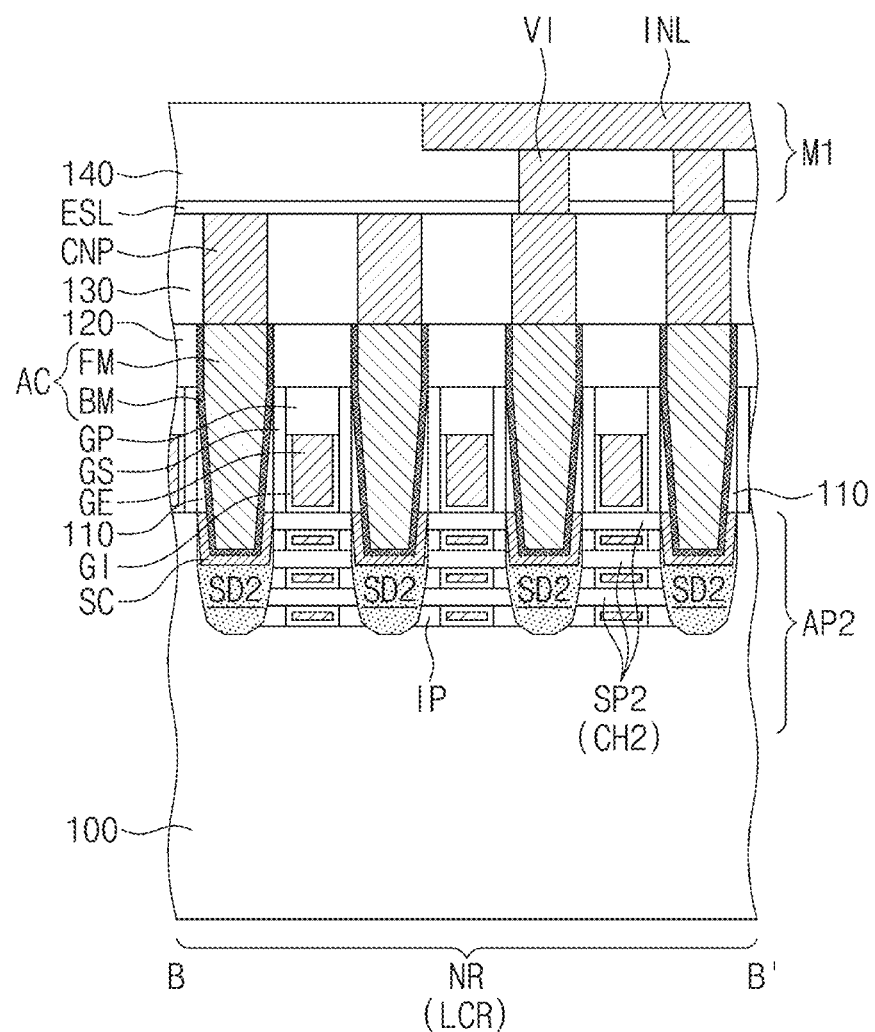
Figure 20C:
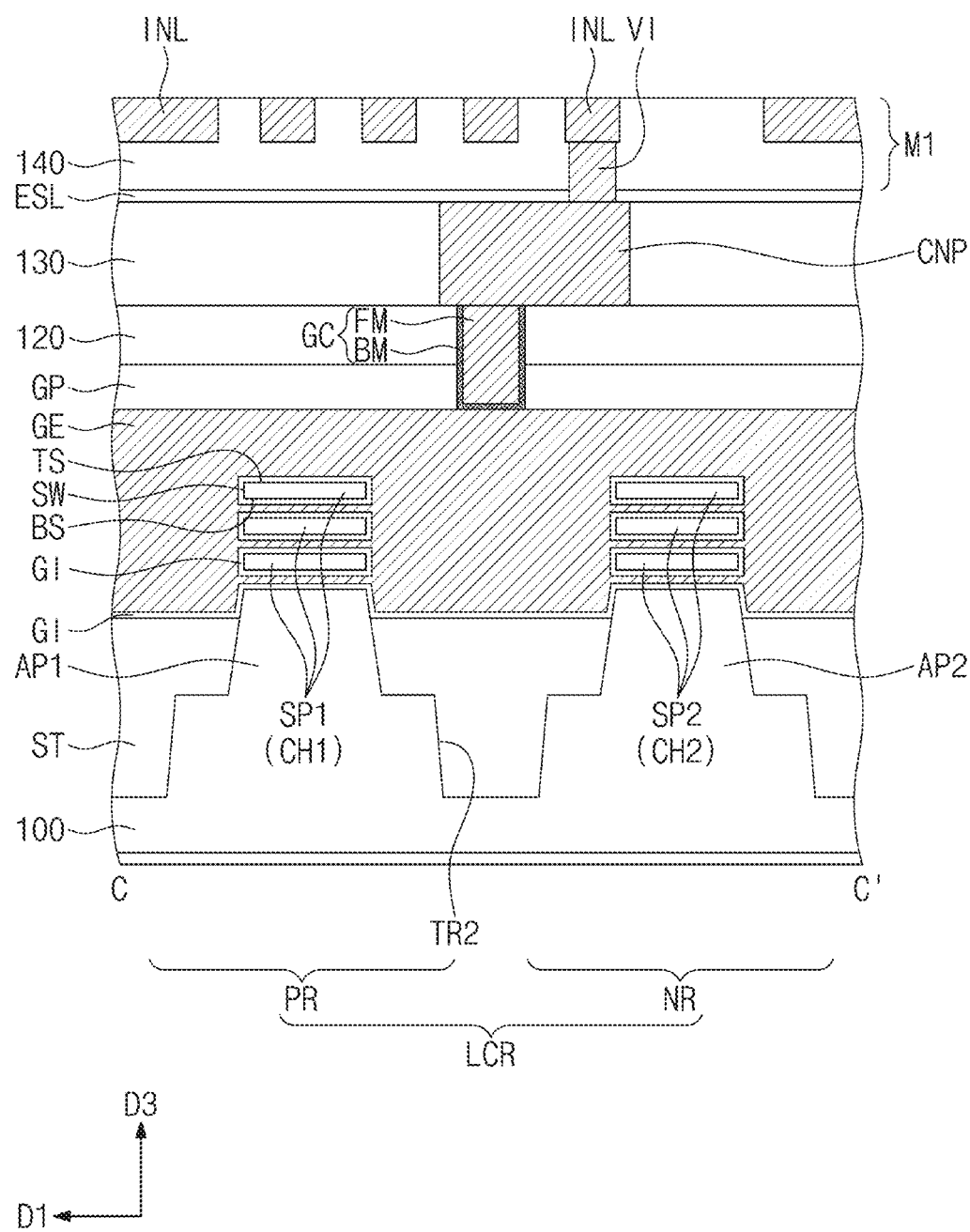
Figure 20D:
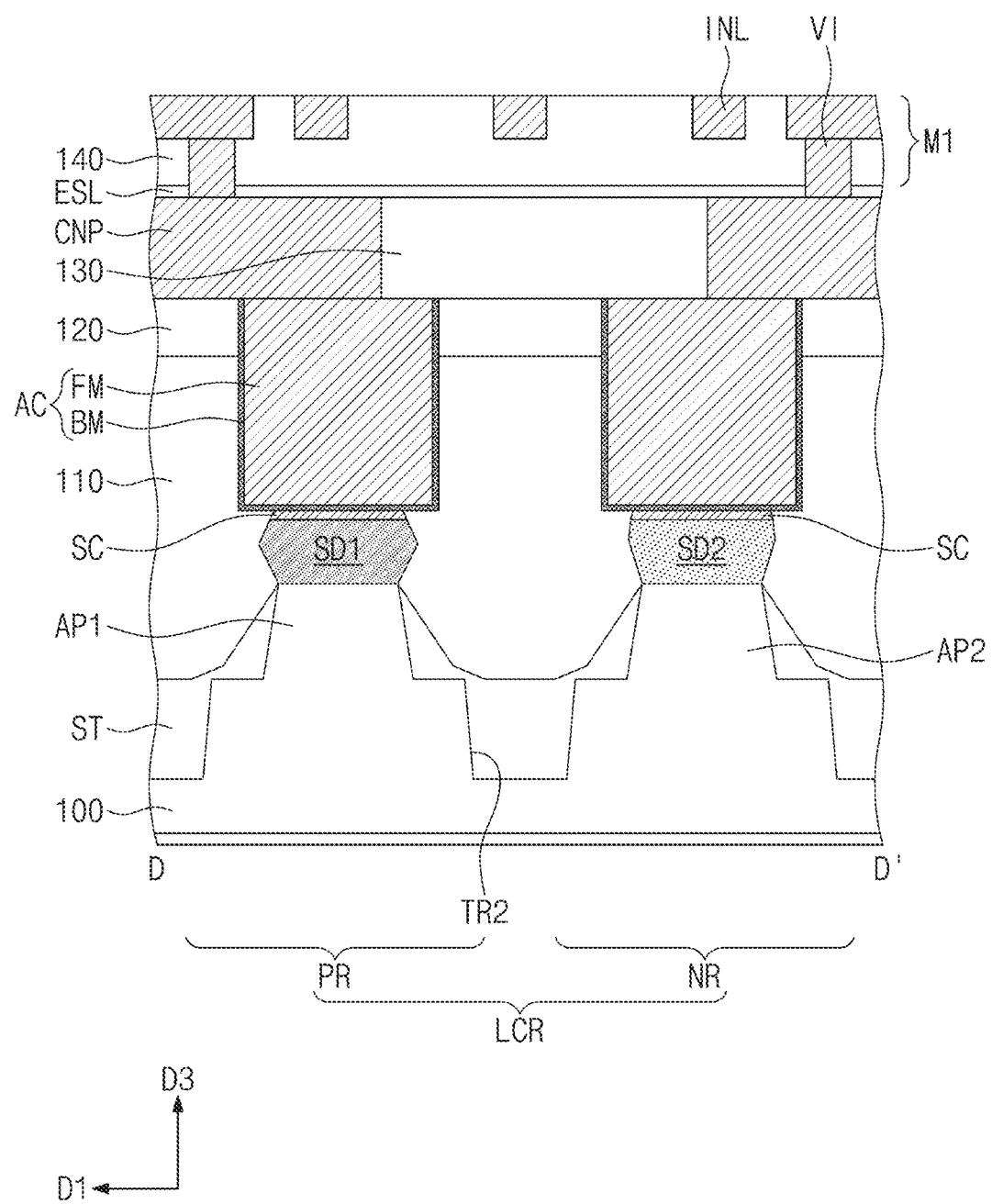
Figure 20E:
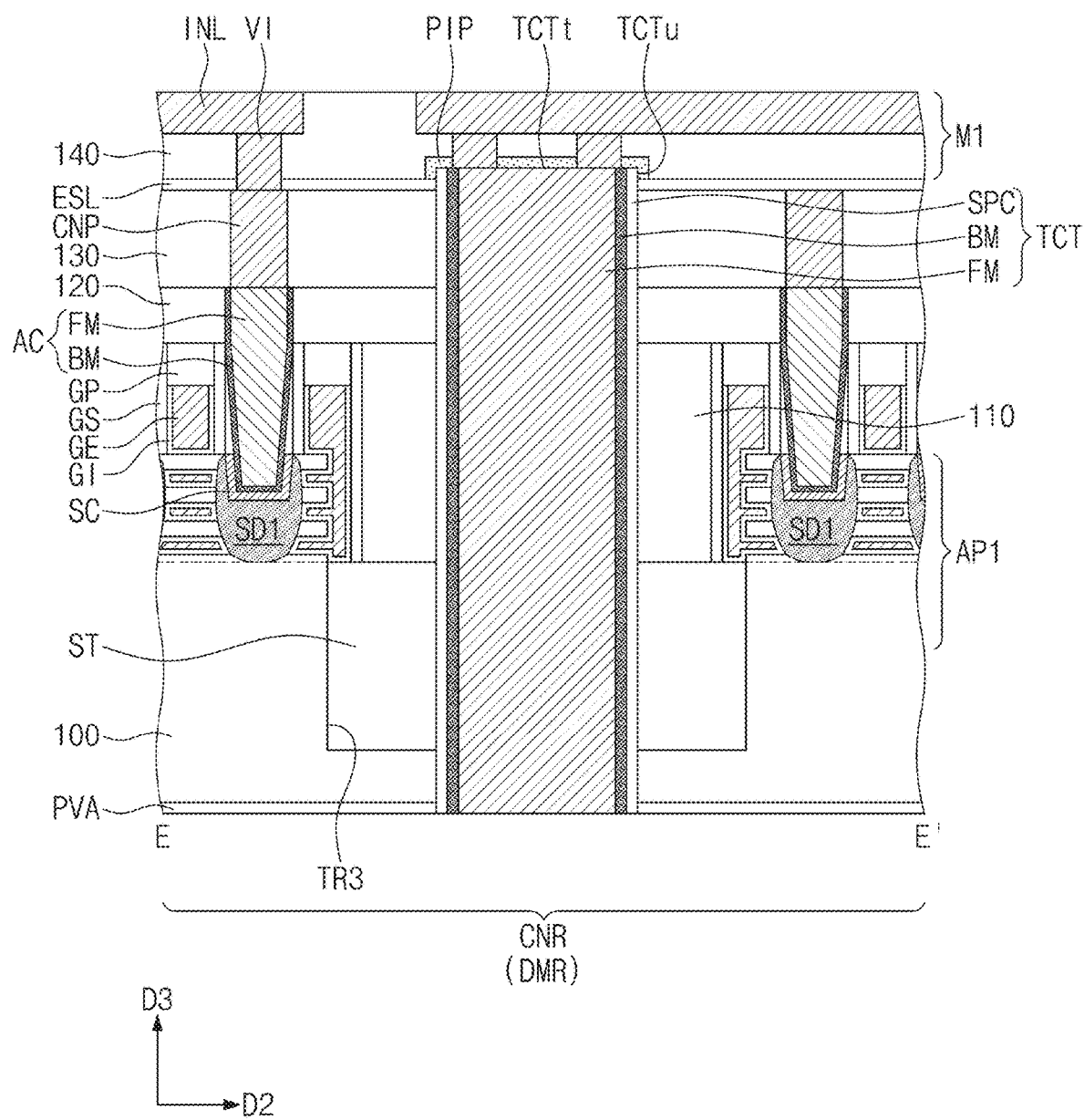

FIG. 19 is a sectional view illustrating a semiconductor package according to an example embodiment of the inventive concepts. For concise description, an element previously described with reference to FIG. 18 will be identified by the same reference number without repeating an overlapping description thereof, and features different from that of the previous embodiment will be described in more detail below.

Referring to FIG. 19, a semiconductor package may include the logic chip LGC, which is provided on a package substrate PKS, and a memory stack MES, which is stacked on the logic chip LGC. For example, the memory stack MES may include first to third memory chips MEC1, MEC2, and MEC3, which are stacked on the logic chip LGC.

The logic chip LGC and the first memory chip MEC1 may be connected to each other through at least one of the through contacts TCT penetrating the substrate 100 of the logic chip LGC, as previously described with reference to FIG. 18.

At least one first penetration via TSV1 may be provided to penetrate the first memory chip MEC1. At least one second penetration via TSV2 may be provided to penetrate the second memory chip MEC2. The first to third memory chips MEC1, MEC2, and MEC3 may be connected to each other through the first penetration via TSV1 and the second penetration via TSV2. The penetration via may not be provided in the uppermost one of the memory chips (e.g., the third memory chip MEC3).

Connection pads BP may be respectively provided between the through contact TCT and the first memory chip MEC1, between the first penetration via TSV1 and the second memory chip MEC2, and between the second penetration via TSV2 and the third memory chip MEC3.

Connection members CM may be provided between the package substrate PKS and the metal layer ML of the logic chip LGC to electrically connect the package substrate PKS and the metal layer ML to each other.

In some example embodiments, the memory stack MES may be provided on the logic chip LGC, and they may be vertically connected to each other through the through contact TCT, the first penetration via TSV1, and the second penetration via TSV2. Since the logic chip LGC and the memory stack MES are vertically and directly connected to each other, a signal path therebetween may be relatively shortened. Accordingly, it may be possible to increase an operation speed of the semiconductor package according to some example embodiments.

FIGS. 20A to 20E are sectional views, which are taken along the lines A-A', B-B', C-C', D-D', and E-E', respectively, of FIG. 2 to illustrate a semiconductor device according to an example embodiment of the inventive concepts. For concise description, an element previously described with reference to FIGS. 1, 2, and 3A to 3E will be identified by the same reference number without repeating an overlapping description thereof, and features different from that of the previous embodiment will be described in more detail below.

Referring to FIGS. 2 and 20A to 20E, the substrate 100 including the logic cell region LCR and the connection region CNR may be provided. For example, the logic cell region LCR may include the first and second active regions PR and NR.

The device isolation layer ST may be provided on the substrate 100. The device isolation layer ST may define the first active pattern AP1 and the second active pattern AP2 in an upper portion of the substrate 100. The first active pattern AP1 and the second active pattern AP2 may be defined on the first and second active regions PR and NR, respectively.

The first and second active patterns AP1 and AP2 may include the first channel pattern CH1 and the second channel pattern CH2, respectively. In detail, the first channel pattern CH1 may include a plurality of first semiconductor patterns SP1, which are vertically stacked. The first semiconductor patterns SP1 stacked may be spaced apart from each other in a third direction D3. The first semiconductor patterns SP1 stacked may be overlapped with each other, when viewed in a plan view. The second channel pattern CH2 may include a plurality of second semiconductor patterns SP2, which are vertically stacked. The second semiconductor patterns SP2 stacked may be spaced apart from each other in the third direction D3. The second semiconductor patterns SP2 stacked may be overlapped with each other, when viewed in a plan view. The first and second semiconductor patterns SP1 and SP2 may be formed of or include at least one of silicon (Si), germanium (Ge), or silicon-germanium (SiGe).

The first active pattern AP1 may further include the first source/drain patterns SD1. The first semiconductor patterns SP1, which are stacked to include the first channel pattern CH1, may be interposed between each adjacent pair of the first source/drain patterns SD1. The stack of the first semiconductor patterns SP1 may connect the adjacent pair of the first source/drain patterns SD1 to each other.

The second active pattern AP2 may further include the second source/drain patterns SD2. The second semiconductor patterns SP2, which are stacked to include the second channel pattern CH2, may be interposed between each adjacent pair of the second source/drain patterns SD2. The stack of the second semiconductor patterns SP2 may connect the adjacent pair of the second source/drain patterns SD2 to each other.

The gate electrodes GE may be provided to cross the first and second channel patterns CH1 and CH2 and to extend in the first direction D1. The gate electrode GE may be overlapped with the first and second channel patterns CH1 and CH2, when viewed in a plan view. A pair of the gate spacers GS may be disposed on both side surfaces of the gate electrode GE. The gate capping pattern GP may be provided on the gate electrode GE.

Referring back to FIG. 20C, the gate electrode GE may surround each of the first and second semiconductor patterns SP1 and SP2. For example, the gate electrode GE may be provided on a top surface TS, at least one side surface SW, and a bottom surface BS of the uppermost one of the first semiconductor patterns SP1. For example, the gate electrode GE may surround a top surface, a bottom surface, and both side surfaces of each of the first and second semiconductor patterns SP1 and SP2. A transistor according to some example embodiments may be a three-dimensional field-effect transistor (e.g., a multi-bridge channel field-effect transistor (MBCFET)), in which the gate electrode GE is provided to three-dimensionally surround the channel patterns CH1 and CH2.

Referring back to FIGS. 2 and 20A to 20E, the gate dielectric pattern GI may be provided between each of the first and second channel patterns CH1 and CH2 and the gate electrode GE. The gate dielectric pattern GI may surround each of the first and second semiconductor patterns SP1 and SP2.

On the second active region NR, an insulating pattern IP may be interposed between the gate dielectric pattern GI and the second source/drain pattern SD2. The gate electrode GE may be spaced apart from the second source/drain pattern SD2 by the gate dielectric pattern GI and the insulating pattern IP. By contrast, the insulating pattern IP may be omitted on the first active region PR.

The first interlayer insulating layer 110 and the second interlayer insulating layer 120 may be provided on the substrate 100. The active contacts AC may be provided to penetrate the first and second interlayer insulating layers 110 and 120 and to be connected to the first and second source/drain patterns SD1 and SD2, respectively. The gate contact GC may be provided to penetrate the second interlayer insulating layer 120 and the gate capping pattern GP and to be electrically connected to the gate electrode GE. The active contacts AC and the gate contacts GC may be configured to have substantially the same features as those described with reference to FIG. 2 and FIGS. 3A to 3D.

The third interlayer insulating layer 130 may be provided on the second interlayer insulating layer 120. The connection patterns CNP may be provided in the third interlayer insulating layer 130. The fourth interlayer insulating layer 140 may be provided on the third interlayer insulating layer 130. The first metal layer M1 may be provided in the fourth interlayer insulating layer 140.

The through contact TCT may be provided on the connection region CNR. The through contact TCT may penetrate the device isolation layer ST filling the third trench TR3 and the substrate 100 thereunder. The through contact TCT may be vertically extended from the bottom of the fourth interlayer insulating layer 140 to the bottom surface of the substrate 100. The through contact TCT may be configured to have substantially the same features as those described with reference to FIGS. 2 and 3E.

Figure 21:
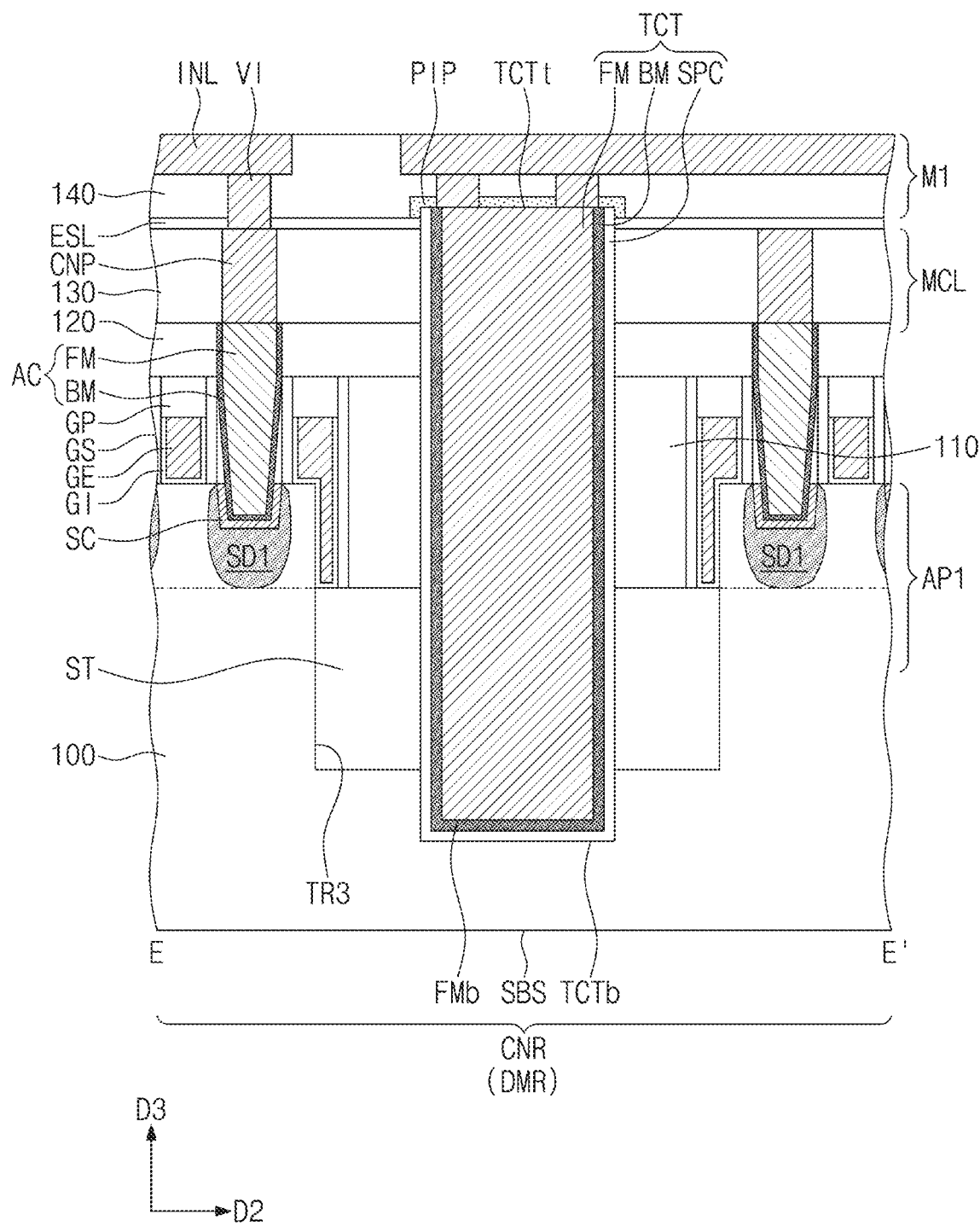
FIG. 21 is a sectional view, which is taken along the line E-E' of FIG. 2 to illustrate a semiconductor device according to an example embodiment of the inventive concepts.

FIG. 21 is a sectional view, which is taken along the line E-E' of FIG. 2 to illustrate a semiconductor device according to an example embodiment of the inventive concepts. For concise description, an element previously described with reference to FIGS. 1, 2, and 3A to 3E will be identified by the same reference number without repeating an overlapping description thereof, and features different from that of the previous embodiment will be described in more detail below.

Referring to FIGS. 2 and 21, a bottom surface TCTb of the through contact TCT may be located at a level higher than the bottom surface SBS of the substrate 100. That is, the bottom surface TCTb of the through contact TCT may be covered with the substrate 100. The barrier pattern BM and the insulating spacer SPC may be interposed between a bottom surface FMb of the conductive pattern FM of the through contact TCT and the substrate 100. The barrier pattern BM may directly cover the bottom surface FMb of the conductive pattern FM. The insulating spacer SPC may be interposed between the barrier pattern BM, which covers the bottom surface FMb of the conductive pattern FM, and the substrate 100.

According to an example embodiment of the inventive concepts, a semiconductor device may include a through contact, which is provided to penetrate a substrate of a logic chip and is used to realize a chip stack, in which the logic chip and a memory chip are stacked and are connected to each other. In the semiconductor device, it may be possible to prevent a process defect, which may occur when the through contact is formed, and to improve reliability of the semiconductor device. Since a metal layer of the logic chip is directly connected to a metal layer of the memory chip through the through contact, it may be possible to reduce a signal path between the logic chip and the memory chip and thereby to realize the semiconductor device with a high operation speed.

While example embodiments of the inventive concept have been particularly shown and described, it will be understood by one of ordinary skill in the art that variations in form and detail may be made therein without departing from the spirit and scope of the attached claims.

What is claimed is:

1. A semiconductor device, comprising:
    a substrate including a logic cell region and a connection region;
    a dummy transistor on the connection region;
    an intermediate connection layer on the dummy transistor;
    a first metal layer on the intermediate connection layer;
    an etch stop layer between the intermediate connection layer and the first metal layer;
    a through contact below the first metal layer penetrating the connection region, an upper portion of the through contact protruding above the etch stop layer; and
    a protection insulating pattern on the etch stop layer covering the upper portion of the through contact, the protection insulating pattern having a bottommost layer on an upper surface of the etch stop layer, and the protection insulating pattern covering an upper side surface of the through contact and a top surface of the through contact.

2. The semiconductor device of claim 1, further comprising:
    a logic transistor on the logic cell region,
    wherein each of the logic transistor and the dummy transistor is a three-dimensional field effect transistor.

3. The semiconductor device of claim 1, wherein the intermediate connection layer comprises:
    an active contact electrically connected to a source/drain pattern of the dummy transistor; and
    a gate contact electrically connected to a gate electrode of the dummy transistor.

4. The semiconductor device of claim 3, wherein the intermediate connection layer further comprises:
    connection patterns, which are on the active contact and the gate contact.

5. The semiconductor device of claim 1, wherein the dummy transistor comprises:
    an active pattern on the connection region;
    a device isolation layer filling a trench, which divides the active pattern into two portions;
    a gate electrode crossing the active pattern; and
    a source/drain pattern adjacent to a side of the gate electrode,
    wherein the through contact penetrates the device isolation layer.

6. The semiconductor device of claim 1, wherein the first metal layer comprises:
    a via, the via penetrating the protection insulating pattern and connected to the top surface of the through contact; and
    an interconnection line on the via.

7. The semiconductor device of claim 1, wherein the through contact comprises:
    a pillar-shaped conductive pattern;
    a barrier pattern surrounding an outer side surface of the conductive pattern; and
    an insulating spacer surrounding an outer side surface of the barrier pattern.

8. The semiconductor device of claim 1, wherein the first metal layer is in an interlayer insulating layer on the etch stop layer, and the top surface of the through contact is located at a level between bottom and top surfaces of the interlayer insulating layer.

9. The semiconductor device of claim 1, wherein the etch stop layer has an etch selectivity with respect to the protection insulating pattern.

10. The semiconductor device of claim 1, wherein the protection insulating pattern partially covers a top surface of the etch stop layer adjacent to the through contact.

11. A semiconductor device, comprising:
    a substrate including a logic cell region and a connection region;
    a dummy transistor on the connection region;
    a first interlayer insulating layer on the dummy transistor, an intermediate connection layer in the first interlayer insulating layer;
    a second interlayer insulating layer on the first interlayer insulating layer, a first metal layer in the second interlayer insulating layer;
    an etch stop layer between the first and second interlayer insulating layers;
    a through contact below the first metal layer of the connection region and extending from a bottom of the second interlayer insulating layer to a bottom surface of the substrate, a top surface of the through contact is higher than a top surface of the etch stop layer; and
    a protection insulating pattern provided on the etch stop layer to cover an upper portion of the through contact, the protection insulating pattern partially covering the top surface of the etch stop layer, and the protection insulating pattern extends from the top surface of the etch stop layer to the top surface of the through contact.

12. The semiconductor device of claim 11, further comprising:
    a logic transistor on the logic cell region,
    wherein each of the logic transistor and the dummy transistor is a three-dimensional field effect transistor.

13. The semiconductor device of claim 11, wherein the dummy transistor comprises:
    an active pattern on the connection region;
    a device isolation layer filling a trench, which divides the active pattern into two portions;
    a gate electrode crossing the active pattern; and
    a source/drain pattern adjacent to a side of the gate electrode,
    wherein the through contact penetrates the device isolation layer.

14. The semiconductor device of claim 11, wherein the first metal layer comprises:
    a via, the via penetrating the protection insulating pattern and connected to the top surface of the through contact; and
    an interconnection line on the via.

15. The semiconductor device of claim 11, wherein the top surface of the through contact is located at a level between bottom and top surfaces of the second interlayer insulating layer.

16. A semiconductor device, comprising:
    a substrate including a logic cell region and a connection region;
    an active pattern on each of the logic cell region and connection region;
    a device isolation layer covering a lower side surface of the active pattern, an upper portion of the active pattern protruding above the device isolation layer;
    a gate electrode crossing the active pattern;

a source/drain pattern, which is adjacent to a side of the gate electrode and fills a recess in the upper portion of the active pattern;

an intermediate connection layer on the gate electrode and the source/drain pattern, the intermediate connection layer including an active contact and a gate contact, which are electrically connected to the source/drain pattern and the gate electrode, respectively;

a first metal layer on the intermediate connection layer, the first metal layer including interconnection lines and vias electrically connecting the interconnection lines to the intermediate connection layer;

an etch stop layer between the intermediate connection layer and the first metal layer;

a through contact below the first metal layer penetrating the connection region, an upper portion of the through contact protruding above the etch stop layer; and a protection insulating pattern on the etch stop layer covering an upper portion of the through contact, the protection insulating pattern having a bottommost layer on an upper surface of the etch stop layer, and the protection insulating pattern covering an upper side surface of the through contact and a top surface of the through contact, at least one via of the vias penetrates the protection insulating pattern and is connected to the through contact, and at least one interconnection line of the interconnection lines is electrically connected to the through contact through the at least one via.

17. The semiconductor device of claim 16, wherein the protection insulating pattern partially covers a top surface of the etch stop layer adjacent to the through contact.

18. The semiconductor device of claim 16, wherein the intermediate connection layer further comprises:
   connection patterns between the active and gate contacts and the first metal layer.

19. The semiconductor device of claim 16, wherein the through contact penetrates the device isolation layer on the connection region.

* * * * *